(12) United States Patent
Chen et al.

(10) Patent No.: US 8,760,928 B2
(45) Date of Patent: Jun. 24, 2014

(54) NAND FLASH BIASING OPERATION

(71) Applicant: Macronix International Co., Ltd, Science Based Industrial Park (TW)

(72) Inventors: Ti-Wen Chen, Tainan (TW); Hang-Ting Lue, Hsinchu (TW); Shuo-Nan Hung, Hsinchu (TW); Shih-Lin Huang, Penghu (TW); Chih-Chang Hsieh, Hsinchu (TW); Kuo-Pin Chang, Miaoli (TW)

(73) Assignee: Macronix International Co. Ltd., Hsinchu (TW)

( * ) Notice: Subject to any disclaimer, the term of this patent is extended or adjusted under 35 U.S.C. 154(b) by 0 days.

(21) Appl. No.: 13/710,992

(22) Filed: Dec. 11, 2012

(65) Prior Publication Data
US 2013/0343130 A1    Dec. 26, 2013

Related U.S. Application Data

(60) Provisional application No. 61/661,852, filed on Jun. 20, 2012.

(51) Int. Cl.
| | |
|---|---|
| *G11C 16/26* | (2006.01) |
| *G11C 16/24* | (2006.01) |
| *G11C 16/04* | (2006.01) |
| *G11C 11/56* | (2006.01) |
| *G11C 5/14* | (2006.01) |

(52) U.S. Cl.
CPC ............ *G11C 16/26* (2013.01); *G11C 16/0483* (2013.01); *G11C 11/5642* (2013.01); *G11C 5/146* (2013.01)
USPC .............. 365/185.18; 365/185.17; 365/185.2; 365/185.27

(58) Field of Classification Search
CPC ............... G11C 16/06; G11C 11/5642; G11C 16/0483; G11C 5/1462
USPC ................ 365/185.17, 185.18, 185.27, 185.2
See application file for complete search history.

(56) References Cited

U.S. PATENT DOCUMENTS

| | | |
|---|---|---|
| 7,315,474 B2 | 1/2008 | Lue |
| 2011/0235398 A1* | 9/2011 | Hosono ......................... 365/148 |

(Continued)

OTHER PUBLICATIONS

Wang H-H et al., "A New Read-Distrub Failure Mechanism Caused by Boosting Hot-Carrier Injection Effect in MLC NAND Flash Memory," IEEE Int'l Memory Workshop, 2009, pp. 1-2.

(Continued)

*Primary Examiner* — Ly D Pham
(74) *Attorney, Agent, or Firm* — Haynes Beffel & Wolfeld LLP

(57) ABSTRACT

A charge storage memory is configured in a NAND array, and includes NAND strings coupled to bit lines via string select switches and includes word lines. A controller is configured to produce a bias for performing an operation on a selected cell of the NAND array. The bias includes charging the bit line while the string select switches are closed, such as to not introduce noise into the strings caused by such bit line charging. The semiconductor body regions in memory cells that are on both sides of the memory cells in the NAND strings that are coupled to a selected word line are coupled to reference voltages such that they are pre-charged while the word lines of the strings in the array are transitioned to various voltages during the operation.

22 Claims, 19 Drawing Sheets

(56) References Cited

U.S. PATENT DOCUMENTS

2011/0305088 A1    12/2011    Huang et al.
2012/0182802 A1    7/2012    Hung et al.
2013/0088920 A1    4/2013    Huang et al.

OTHER PUBLICATIONS

U.S. Appl. No. 13/827,475, filed Mar. 14, 2013 S-N Hung, et al., "Programmng Technique for Reducing Program Disturb in Stacked Memory Structures," 47 pp.

\* cited by examiner

NAND FLASH BIASING OPERATION

CROSS-REFERENCE TO RELATED APPLICATION

Benefit is claimed of U.S. Provisional Application No. 61/661,852, filed 20 Jun. 2012.

BACKGROUND OF THE INVENTION

1. Field of the Invention

The present invention relates to flash memory technology, and more particularly to flash memory suitable for high density implementations.

2. Description of Related Art

Flash memory is a class of nonvolatile integrated circuit memory technology. Traditional flash memory employs floating gate memory cells. Another type of memory cell used for flash memory can be referred to as a charge trapping memory cell, which uses a dielectric charge trapping layer in place of the floating gate.

The typical flash memory cell consists of a field effect transistor FET structure having a source and drain separated by a channel, and a gate separated from the channel by a charge storage structure including a tunnel dielectric layer, the charge storage layer (floating gate or dielectric), and a blocking dielectric layer. According to the early conventional charge trapping memory designs referred to as SONOS devices, the source, drain and channel are formed in a silicon substrate (S), the tunnel dielectric layer is formed of silicon oxide (O), the charge storage layer is formed of silicon nitride (N), the blocking dielectric layer is formed of silicon oxide (O), and the gate comprises polysilicon (S).

Data is stored in a flash memory device by controlling the amount of charge trapped in the charge storage structure. The amount of charge stored sets a threshold voltage for the memory cell in flash memory devices, which allows the data to be sensed.

As specifications for the values of target threshold voltages tighten for low voltage applications, and for applications that store multiple bits per cell, problems are arising with charge retention over many data sensing cycles. Specifically, problems arise with minimizing the effects of noise that in the cells and preventing unwanted charge tunneling into memory cells by operations directed at other cells.

For sensing operations performed on strings of memory cells, biasing techniques can be applied to limit the effects of noise that is introduced into the cells which is caused by the charging of bit lines in preparation for sensing a bit stored in a memory cell. For example, as the bit line is being charged, the strings of memory cells can be isolated from the bit line by opening the string select switches that connect such strings to the bit line.

While this technique of opening the string select switch during bit line setup can limit the effects of noise on the memory cells, it can introduce another problem of unwanted charge tunneling into cells created through self-induced capacitive boosting within the strings of memory cells. For example, if the string select switch is open, preventing current flow to the bit line from the string, when a voltage that is below the high threshold voltage level is placed on a selected memory cell that is in a high threshold voltage state, the current path throughout the entire semiconductor body of the memory cells in the string is broken at the selected cell. This leaves the section between the selected cell and the string select switch floating. The voltage transitions, of pass voltages on the memory cells with floating semiconductor bodies, cause capacitive boosting. Such boosting in turn creates an electric field causing unwanted charge to tunnel into the selected cell or other cells, through hot carrier injection for example.

It is therefore desirable to provide a new memory technology that provides reduced capacitive boosting while still limiting the amount of noise that is introduced to the cells through the charging of bit lines.

SUMMARY

An integrated circuit is described including flash memory, that is configured for applying a bias arrangement including, (1) applying voltages to the unselected and selected word lines in a selected string of memory cells, (2) pre-charging the semiconductor body regions of strings of memory cells by coupling the semiconductor body regions of memory cells on both sides of the selected word line to a reference voltage, and (3) charging the sensing node to a sensing voltage while the switches between the strings and the sensing node are open so as to isolate the strings from the noise that is caused by setting up voltages on the sensing nodes. Capacitive boosting, as a result of transitions on unselected word lines during the time the string is isolated from the sensing node, is reduced or prevented by coupling the semiconductor bodies to the reference voltage during some or all of that time. The biasing arrangements usable to accomplish this condition can be applied in single layer, and multiple layer (e.g. 3D) memory arrays.

A memory device is described that includes a plurality of memory cells arranged in series in the semiconductor body and a NAND string in a NAND array, having a plurality of word lines coupled to corresponding memory cells. Control circuitry is coupled to the plurality of word lines and to the semiconductor body adapted for determining whether or not current flows in a selected target memory cell as a result of its threshold being below a certain voltage level, according to the previously mentioned bias arrangements.

Other aspects and advantages of the present invention can be seen on review of the drawings, the detailed description and the claims which follow.

DETAILED DESCRIPTION

A detailed description of embodiments of the present invention is provided with reference to FIGS. 1-14.

Figure 1:
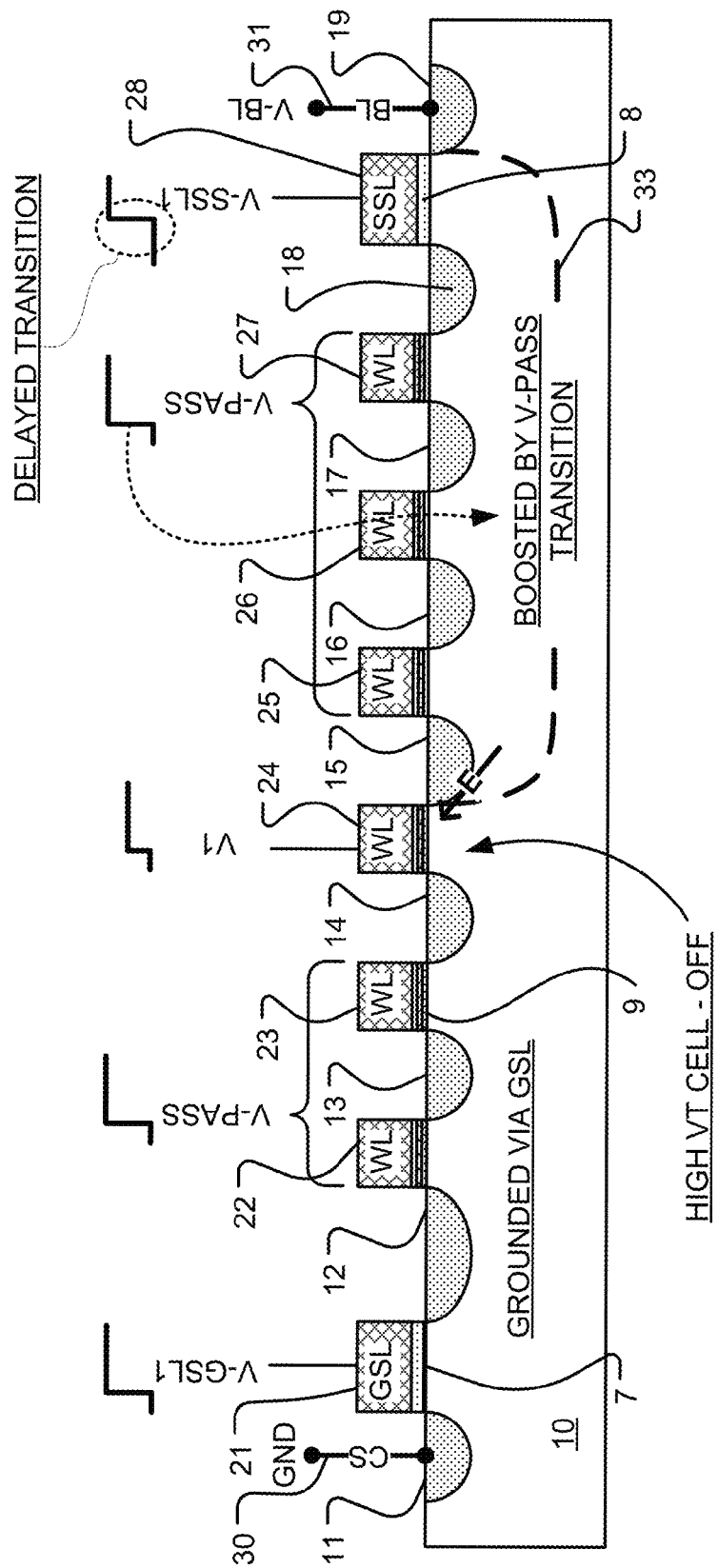
FIG. 1 is a simplified cross-sectional view of a selected NAND string that shows a bias arrangement.

FIG. 1 is a simplified cross-sectional view of a selected NAND string that shows a bias arrangement. The NAND string includes a plurality of flash memory cells that are arranged in series. Another technology for implementation of NAND flash using bandgap engineered SONOS (BE-SONOS) charge trapping technology is described in U.S. Pat. No. 7,315,474 by Lue, which is incorporated by reference as if fully set forth herein. NAND strings can be implemented in a variety of configurations, including finFET technology, shallow trench isolation technology, vertical NAND technology and others. Yet another 3D NAND architecture is described in co-pending U.S. patent application Ser. No. 13/239,760 (now U.S. Patent Publication No. 2012-0182802) entitled "Memory Architecture of 3D Array With Improved Uniformity of Bit Line Capacitances" which application is incorporated by reference as if fully set forth herein, and which application was commonly owned at the time of invention, and is currently owned in common with the present invention. Floating gate memory cells, using conductive floating gates, can be implemented in NAND architectures as well.

Referring to FIG. 1, the memory cells are formed in a semiconductor body 10. For n-channel memory cells, the semiconductor body 10 can be an isolated p-well, within a deeper n-well in a semiconductor chip. Alternatively, the semiconductor body 10 can be isolated by an insulating layer or otherwise.

The plurality of flash memory cells are arranged in a string extending in a bit line direction, orthogonal to word lines. Word lines 22-27 extend across a number of parallel NAND strings. Terminals 12-18 are formed by n-type regions (for n-channel devices) in the semiconductor body 10, and act as the source/drain regions for the memory cells. A first switch formed by a MOS transistor (i.e., first switch transistor) having a gate in a ground select line GSL 21, is connected between the memory cell corresponding with first word line 22 and a contact 11 formed by an n-type region in the semiconductor body 10. The contact 11 is connected to a common source line 30. The contact 11 is an example of a "reference node" as the term is used herein. As each NAND string in an array of NAND strings has a separate contact that is connected to a common source line, the array of NAND strings includes a plurality of reference nodes. A second switch formed by a MOS transistor (i.e., second switch transistor) having a gate in a string select line SSL 28 is connected between the memory cell corresponding to the last word line 27 and a contact 19 formed by an n-type region in the semiconductor body 10. The contact 19 is connected to a sensing node, such as bit line 31. Bit line 31 is an example of a "sensing node" as the term is used herein. For the illustrated embodiment, as bit line 31 acts as a sensing node, and common source line 30 acts as a reference node. However, it is appreciated that in an alternate embodiment, the common source line 30 can serve as the sensing node and the bit line 31 can serve as the reference node. The first and second switches in the illustrated embodiment are MOS transistors, having gate dielectrics 7 and 8 formed by, for example, silicon dioxide.

In this illustration, there are six memory cells in the string for simplicity. In typical implementations, a NAND string may comprise 32, 64 or more memory cells arranged in series. The memory cells corresponding to the word lines 22-27 have charge trapping structures 9 between the word lines and channel regions in the semiconductor body 10. The charge trapping structures 9 in the memory cells can be dielectric charge trapping structures, floating gate charge trapping structures, or other flash memory structures suitable for programming using techniques described herein. Also, embodiments of NAND flash structures have been developed which are junction-free, where the terminals 13-17, and optionally terminals 12 and 18, may be omitted from the structure.

In the biasing scheme shown in FIG. 1, a voltage with a first bias (V1) voltage level is set up on word line WL24 of the selected memory cell. The ground select line (GSL) 21 that is coupled to the ground select switch between the selected NAND string and the CSL 30 is set to a V-GSL1 voltage level. V-GSL1 is of a voltage level to cause the first switch to close. As contact 11 is grounded, the activation of the switch connects the semiconductor body region underneath the memory cells that are formed by WL 22 and 23 between the selected memory cell to the common source line 30. A pass voltage bias (V-PASS) is set up on the word lines 22, 23, 25, 26 and 27 of the unselected memory cells. V-PASS is of a sufficient voltage level to allow current to flow through the memory cell, even if such memory cell has the highest specified threshold voltage corresponding to a data value stored in the memory cell. A string select bias (V-SSL1) is set up on select string select line SSL 28 of the selected NAND string to control operation of the second switch. The array of memory cells includes a plurality of NAND strings that are arranged parallel to each other, whereby each NAND string has a corresponding separate string select line that is coupled to a corresponding separate string select switch, e.g. second switch, for each NAND string. Applied bias V-SSL1 transitions the voltage level on SSL 28 during a third interval to cause the second switch, and other string select switches within the array to close so that the threshold voltage level of the selected cell can be determined. As will be shown in more detail in FIGS. 2A and 2B, the transition of V-SSL1 during the third interval so that it can be determined the threshold of the selected cell, occurs at a delayed time with respect to the transition times for V-GSL1, V-PASS and V1. Delaying the transition to V-SSL1 on the SSL reduces the effects of noise that is caused by the bit line voltage (V-BL) being increased.

While delaying the transition of V-SSL1 relative to the transition times for V-GSL, V-PASS and V-1 reduces bit line setup noise on the selected cell, it also can cause condition that lead to unwanted charge tunneling into the cells. Specifically, when the selected memory cell has a high threshold voltage above V-1, the cell is a "High VT cell" as is shown in FIG. 1. The High VT cell remains off under the bias, and the current path in the region 33 of semiconductor body 10 underneath the memory cells formed between the selected memory cell and the second switch is blocked. As a result, the semiconductor body 10 in the region 33 under such memory cells is left floating. Therefore, when a transition in V-PASS at the word lines WL 25, 26 and 27 occurs, the voltage on the semiconductor body region 33 under such memory cells can be boosted through capacitive boosting. Such capacitive boosting can lead to the formation of an electric field "E" at the selected memory cell and at other memory cells in the array that can cause unwanted charge tunneling through hot-carrier injection or other charge tunneling mechanisms. This unwanted charge tunneling adversely affecting data retention.

Figure 2A:
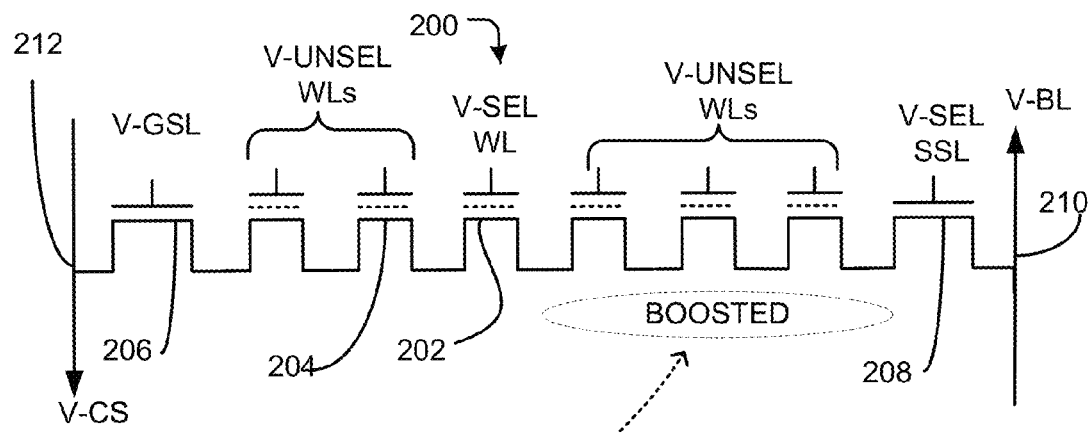
FIGS. 2A and 2B are a simplified circuit diagram of a selected NAND string with an applied bias arrangement and a timing diagram of the applied bias arrangement according to FIG. 1.
Figure 2B:
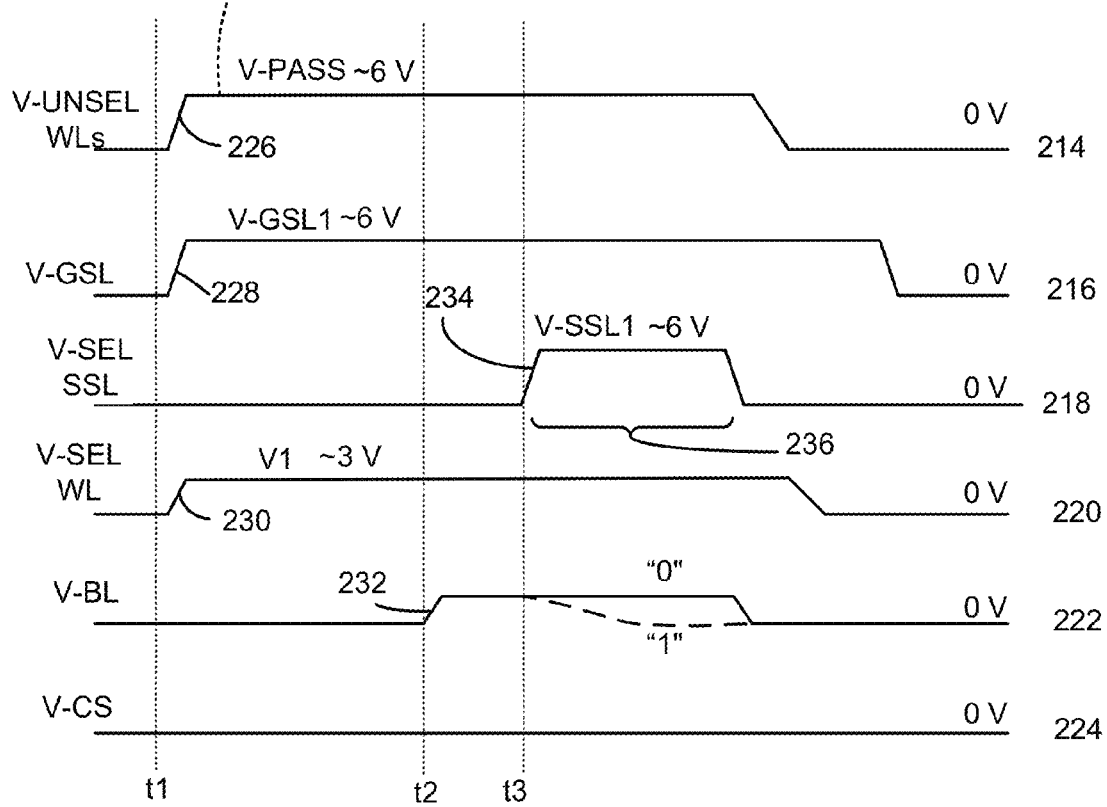

FIGS. 2A and 2B are a simplified circuit diagram of a selected NAND string with an applied bias arrangement and a timing diagram of the applied bias arrangement according to FIG. 1. FIG. 2A shows a circuit diagram of a selected NAND string 200 that is shown in the cross-sectional view of the NAND string shown in FIG. 1. The selected NAND string 200 includes a selected memory cell 202 and unselected memory cells (e.g., 204) between a ground select switch 206 and a string select switch 208. The selected NAND string is arranged between a sensing node 210 and a reference node 212. The selected memory cell 202 is coupled to a selected word line while the unselected memory cells 204 are coupled to unselected word lines. The selected NAND string is coupled through a string select switch 208 to a sensing node 210. The string select switch 208 is coupled to a selected string select line. The sensing node 210 is a bit line. The selected NAND string is coupled through a ground select switch 206 to the reference node 212. The ground select switch 206 is coupled to a ground select line. The reference node 212 is a common source line.

FIG. 2B is a timing diagram of the bias arrangement applied to the selected NAND string. The timing diagram includes a initial interval between t1 and t2, an intermediate interval between t2 and t3 and a final interval after t3. The track of the voltage level of the voltage on the unselected word lines (V-UNSEL WLs) is represented by line 214. The track of the voltage level on the ground select line (V-GSL) is represented by line 216. The track of the voltage level on the selected string select line (V-SEL SSL) is represented by line 218. The track of the voltage level on the selected word line (V-SEL WL) is represented by line 220. The track of the voltage level on the bit line (V-BL) is represented by line 222. The track of the voltage level on the common source line (V-CS) is represented by line 224.

During the initial interval, V-UNSEL WLs is transitioned at 226 to a V-PASS voltage. V-GSL is transitioned at 228 to a V-GSL1 voltage. V-SEL WL is transitioned at 230 to a V1 voltage. V-PASS is of a voltage level that is greater than the threshold voltage of any cells in the NAND string that are in a high threshold voltage state. V-PASS, for example, can be 6V. V-GSL1, for example, can be 6V as well. V1 is of a voltage level that is between the threshold voltage of a cell that is in a high threshold voltage state and the threshold voltage of a cell that is in a low threshold voltage state. V1, for example, can be 3V. As discussed previously, under such biasing scheme, the transition of V-UNSEL WLs to V-PASS at 226 and the transition of V-SEL WL to V1 at 230, can leave the semiconductor body regions under the memory cells between the selected memory cell 202 and the string select switch 208 floating. Such floating in turn leads to self-induced capacitive boosting.

Throughout the duration of the initial interval, V-SEL SSL and V-BL remain at a constant low voltage (e.g. ground). Additionally, through the duration of the initial interval V-CS remains at a constant reference voltage (e.g. ground). The voltage level transitions that occur at 226, 228 and 230 can either occur simultaneously or at different times during the initial interval. The voltage level transition at 228 causes the ground select switch 206 to close, so that the selected NAND string 200 is directly coupled to the reference node 212.

During the intermediate interval, V-UNSEL WLs, V-GSL and V-SEL WL remain the same at the same voltage level. Additionally, during the second interval, the voltage on the sensing node V-BL is transitioned at 232 to a setup voltage. The setup voltage is of a voltage level to allow the threshold voltage of the selected cell to be determined. V-BL remains at the setup voltage level throughout the duration of the intermediate interval and into the final interval. Additionally, during the intermediate interval, V-SEL SSL remains at a constant low voltage level, e.g. ground. As such, the string select switch 208 of the selected NAND string remains open while V-BL is transitioned at 232.

During the final interval, V-SEL SSL is transitioned at 234 to V-SSL1 voltage. V-SSL1 is of a voltage level to cause the string select switch 208 to close so that the NAND string is directly coupled to the sensing node 210. V-SEL SSL remains at V-SSL1 voltage level for a duration 236 of the third interval so that the threshold voltage of the selected memory cell 202 is determined. The direct coupling of the NAND string to the sensing node 210 causes V-BL to remain at the setup voltage or decrease according to the logic level of the data that is stored in the selected memory cell 202. Specifically, if the selected memory cell is in the low threshold voltage state, current flows and V-BL decreases to a low voltage level. Alternatively, if the selected memory cell is in the high threshold voltage state, V-BL remains at the setup voltage. During the final interval, the voltage level on V-BL is sensed to determine the logic level of the selected memory cell by external circuitry (not shown). After the logic level of the selected memory cell is determined in the third interval, the voltages on V-UNSEL WLs, V-GSL and V-SEL WL are transitioned back to a low voltage level (e.g. ground).

Figure 3A:
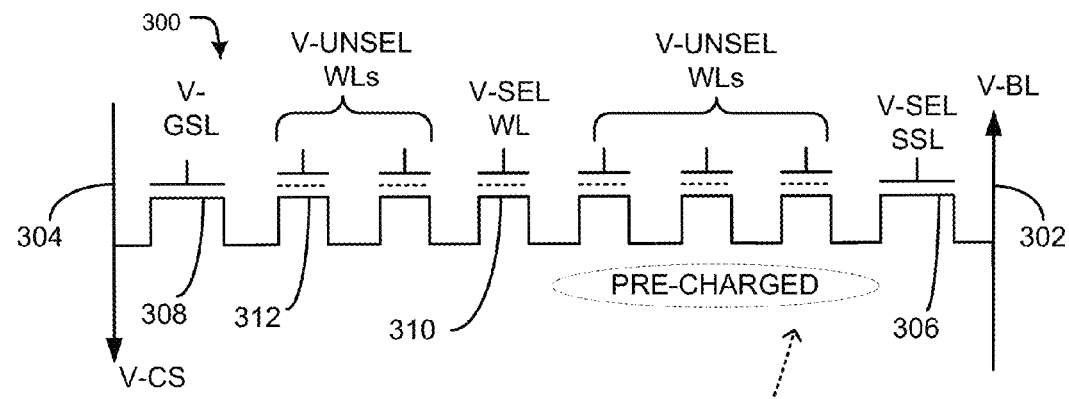
FIGS. 3A and 3B are a simplified circuit diagram of a selected NAND string with an applied bias arrangement and a bias arrangement timing diagram whereby the semiconductor body regions on both sides of the selected cell are coupled to a reference voltage during bit line setup.
Figure 3B:
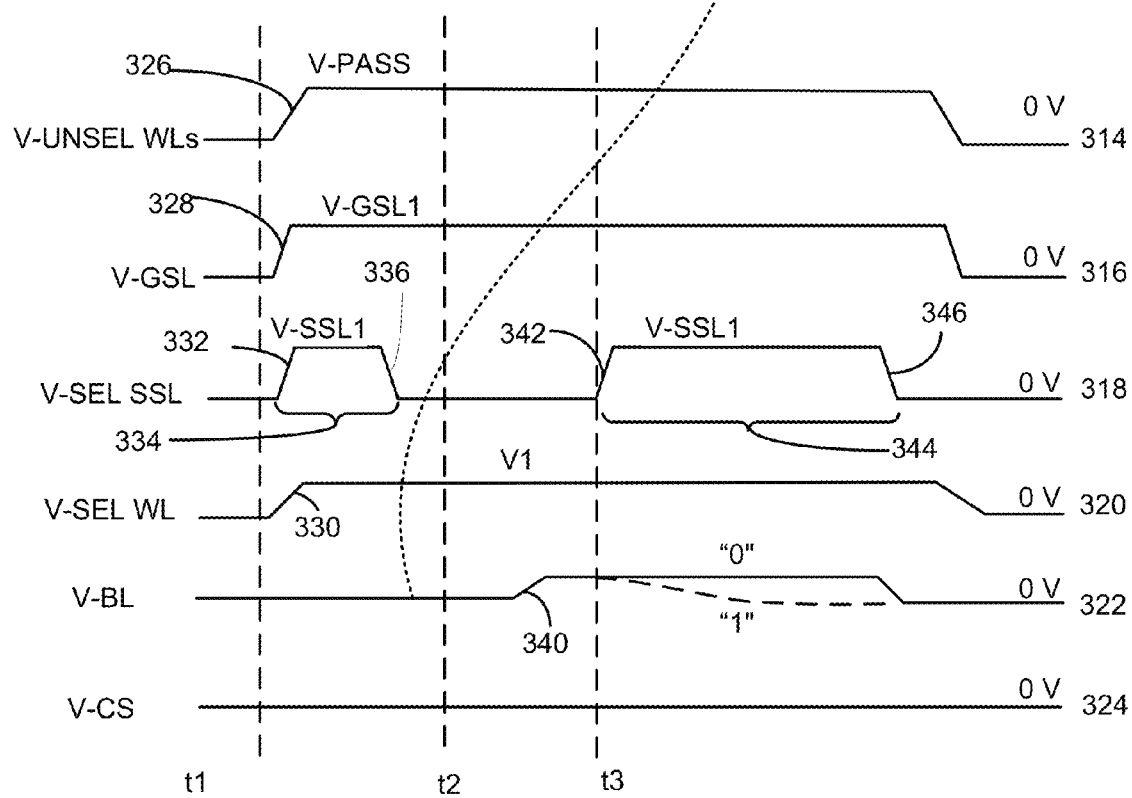

FIGS. 3A and 3B are a simplified circuit diagram of a selected NAND string with an applied bias arrangement and a bias arrangement timing diagram whereby the semiconductor body regions on both sides of the selected cell are coupled to a reference voltage during bit line setup. Specifically, the semiconductor regions are pre-charged as the semiconductor body regions under memory cells on both sides of the selected memory cell are coupled to a reference voltage. Such reference voltage can be a voltage on a common source line, a bit line, or any combination of sources within the memory cell array and corresponding integrated circuit.

The circuit diagram shown in FIG. 3A represents a selected NAND string 300 of memory cells. The selected NAND string 300 includes a selected memory cell 310, the threshold voltage of the selected memory cell being determined during the bias operation. The selected NAND string 300 also includes unselected memory cells 312. The selected NAND string is arranged between a sensing node 302 and a reference node 304. In the shown embodiment the sensing node 302 is a bit line. In an alternate embodiment, the common source line can serve as the sensing node, while the bit line can serve as the reference node. A string select switch 306 is coupled between the NAND string 300 and the sensing node 302. The string select switch 306 is coupled to a string select line. A ground select switch 308 is coupled between the reference node 304 and the selected NAND string 300. The ground select switch 308 is coupled to a ground select line.

FIG. 3B illustrates the voltage levels on the elements of the NAND string that are shown in FIG. 3A during an applied bias arrangement as a function of time. The time during which the bias arrangement is applied includes a first interval, a second interval and a third interval. The first interval is the time between t1 and t2. The second interval is the time between t2 and t3. The third interval is the time after t3.

The track of the voltage level on V-UNSEL WLs is represented by line 314. The track of the voltage level on V-GSL is represented by line 316. The track of the voltage level on V-SEL SSL is represented by line 318. The track of the voltage level on V-SEL WL is represented by line 320. The track of the voltage level on V-BL is represented by line 322. The track of the voltage level on V-CS is represented by line 324.

During the first interval, V-UNSEL WLs is transitioned at 326 to a V-PASS voltage. V-UNSEL WLs remains at the V-PASS voltage level throughout the remaining duration of the first interval after the transition at 326. Also during the first interval, V-GSL is transitioned at 328 to a V-GSL1 voltage. V-GSL remains at the V-GSL1 voltage level throughout the remaining duration of the first interval after the transition at 328. V-BL and V-CS remain at a constant reference voltage level throughout the first interval. Specifically, V-BL can be in a low voltage level (e.g. ground) throughout the first interval. Furthermore, during the first interval, V-SEL WL is transitioned at 330 to a V1 voltage. V1 can be of a voltage level so that the threshold voltage of a selected memory cell can be determined. The determined threshold voltage can be at any voltage level including the high voltage level or the low voltage level. V-PASS can be 6V while V1 can be 3V or below 0V Additionally, during the first interval, V-SEL SSL is transitioned at 332 for a portion 334 of the duration of the first interval to a V-SSL1 voltage. During the portion 334 of the duration of the interval that V-SEL SSL is at a V-SSL1 voltage level, V-BL remains at a low voltage level (e.g. ground). In the shown embodiment, V-SEL SSL can be transitioned at 336 back down to a low voltage level (e.g. ground) during the first interval. In an alternative embodiment (not shown), V-SEL SSL can be kept at V-SSL1 for the remaining duration of the first interval after transition 332, and then be transitioned down to the low voltage level at the beginning of the second interval, after t2 before V-BL is increased to a setup voltage at transition 340.

During the second interval, between t2 and t3, V-UNSEL WLs remain at the V-PASS voltage level, V-GSL remains at the V-GSL1 voltage level and V-SEL WL remains at the V-RD voltage level. Additionally, during the second interval while the voltage level on V-SEL SSL is at a low voltage level (e.g. ground), V-BL is increased to a setup voltage at transition 340. The transitioning of V-BL to a setup voltage at transition 340 while V-SEL SSL is at a low voltage level isolates the selected NAND string 300 from the sensing node 302 during transition 340.

During the third interval, after t3, the voltage on V-SEL SSL is transitioned back to V-SSL1 at 342. As a result, the string select switch 306 is closed, so that the selected NAND string 300 is coupled to the sensing node 302. V-BL changes depending on whether or not the selected cell is in a high or low threshold voltage state. During the third interval, V-SEL SSL is transitioned to V-SSL1 for a duration 344 of the third interval and then returned back to a low voltage level at 346. The duration 344 of the third interval in which V-SEL SSL is transitioned to a V-SSL1 voltage level is long enough to cause the selected memory cell to be sensed. After the voltage on V-BL is sensed, or the voltage on V-SEL SSL is transitioned to a low voltage level at 344, the voltage level on V-UNSEL WLs, V-GSL and V-SEL WL can be dropped to a low voltage level.

In transitioning V-SEL SSL to V-SSL1 at 332 during the first interval, the string select switch of the selected NAND string is closed. Therefore, the NAND string is not only coupled to the reference node 304 with a voltage of V-CS, but also becomes coupled to the sensing node 302 with a voltage of V-BL. V-BL can be set to a reference level during the first interval, so that the memory cells between the selected memory cell 310 and the string select switch 306 are coupled to a reference voltage. Additionally, the memory cells between the selected memory cell 310 and the ground select switch 308 are coupled to the reference voltage level on V-CS. Therefore, during the first interval, while V-UNSEL WLS are transitioned to V-PASS at 326 and V-SEL WL is transitioned to V1 at 330, the memory cells 312 on both sides of the selected memory cells 310 are coupled to a reference voltage. As a result, the memory cells on both sides of the selected memory cells 310 are not left floating during the first interval, so as to limit self-induced capacitive boosting caused by the transition of V-UNSEL WLs to a V-PASS voltage level and V-SEL WL to a V1 voltage level.

Figure 4:
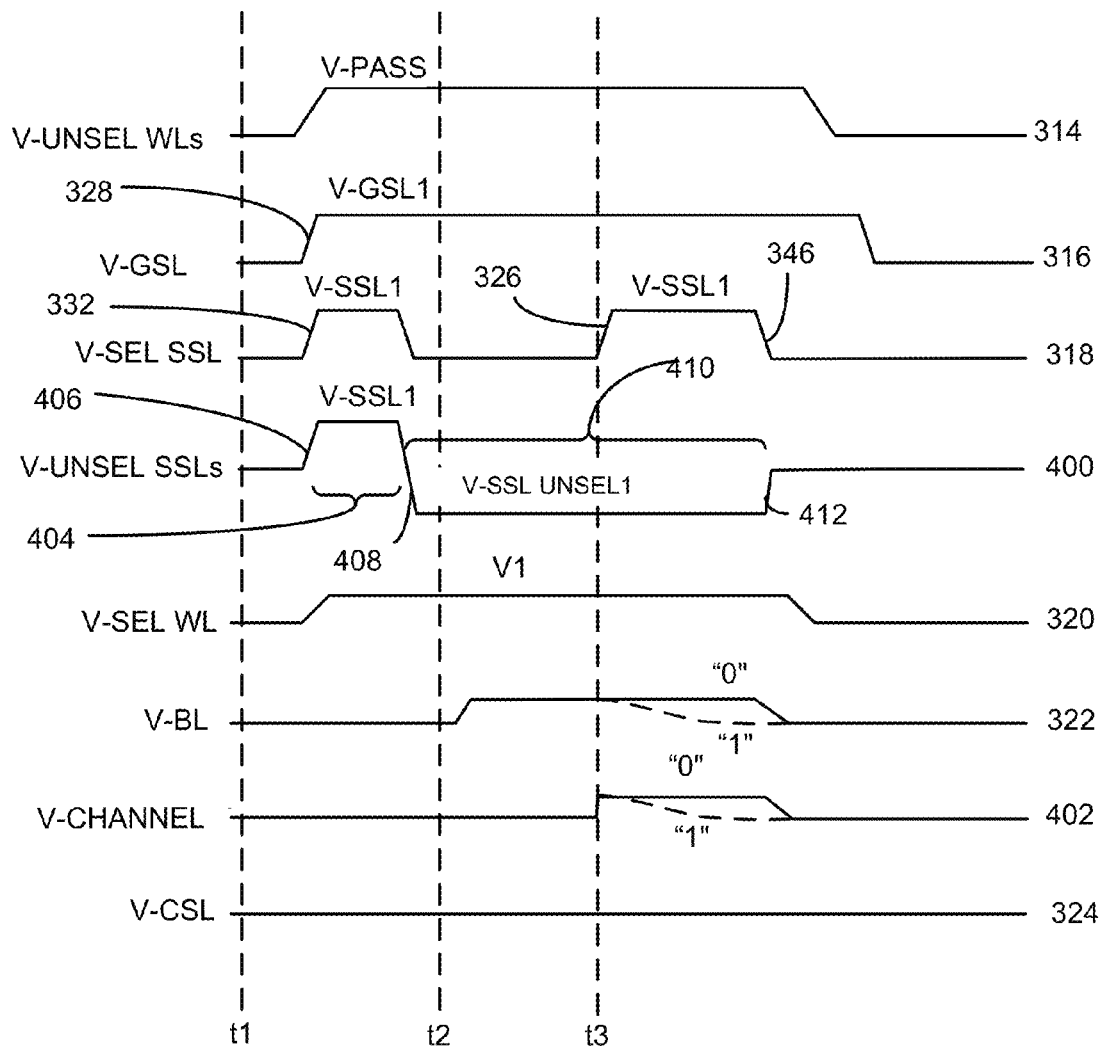
FIG. 4 is a biasing arrangement timing diagram like that shown in FIG. 3B showing unselected NAND string biasing.

FIG. 4 is a biasing arrangement timing diagram like that shown in FIG. 3B that further shows unselected NAND string biasing. Specifically, the timing diagram shows the same tracks of the voltage levels for the same elements as in FIG. 3B for a first interval between t1 and t2, a second interval between t2 and t3, and a third interval, after t3. FIG. 4 also shows the track of the voltage level V-UNSEL SSLs on the unselected string select lines in an array of NAND strings and the voltage level V-CHANNEL of the channel of the selected NAND string. The voltage level of V-UNSEL SSLs are represented by line 400, while the voltage level of V-CHANNEL is represented by line 402.

During the first interval, V-UNSEL SSLs are transitioned at 406 to V-SSL1 voltage for a portion 404 of the duration of the first interval. After the portion of the duration of the first interval 404, V-UNSEL SSLs are transitioned at 408 to V-SSL UNSEL1 voltage. The transition at 408 can occur during the first interval, as is shown, or during the beginning of the second interval. V-UNSEL SSLs remain at the V-SSL UNSEL1 voltage for a duration 410. Such duration 410 can extend into the third interval, as is shown, until after the selected cell is sensed. After the duration 410, during which V-UNSEL SSLs are at the V-SSL UNSEL1 voltage, V-UNSEL SSLs can transition at 412 back to the voltage (e.g. ground) that was on V-UNSEL SSLs at the beginning of the first interval before the transition at 406. Such transition can occur simultaneously with the transition of V-SEL SSL at 346.

The transition of V-UNSEL SSLs at 406 to a V-SSL1 voltage, as with the transition of V-SEL SSL at 332 to V-SSL1, causes the string select switches of the unselected NAND strings to close. As a result, the unselected NAND strings become coupled to the sensing node with a voltage V-BL that has a constant reference voltage on it throughout the first interval. Furthermore as the ground select switches of the unselected NAND string can be coupled to the same ground select line as the selected NAND string, the transition of V-GSL at 328 to a V-GSL1 voltage causes the ground select switches of the unselected NAND strings to close. Thus, the unselected NAND strings become coupled to the reference node. As a result of the transitions at 406 and 328, all portions of the semiconductor body regions in the unselected NAND strings are coupled to a reference voltage during the first interval and not left floating.

V-SSL UNSEL1 is of a voltage level to cause the string select switches of the unselected NAND strings to remain open for the duration 410. This helps to ensure that the unselected NAND strings that share the same sensing node as the selected NAND string are not coupled to the sensing node when the threshold voltage level of the selected memory cell is determined. Additionally, the transition of V-SEL SSL at 326 causes V-CHANNEL to increase during the third interval to the setup voltage level on V-BL. V-CHANNEL then either remains at the setup voltage level or decreases based upon the threshold voltage level of the selected cell.

Figure 5:
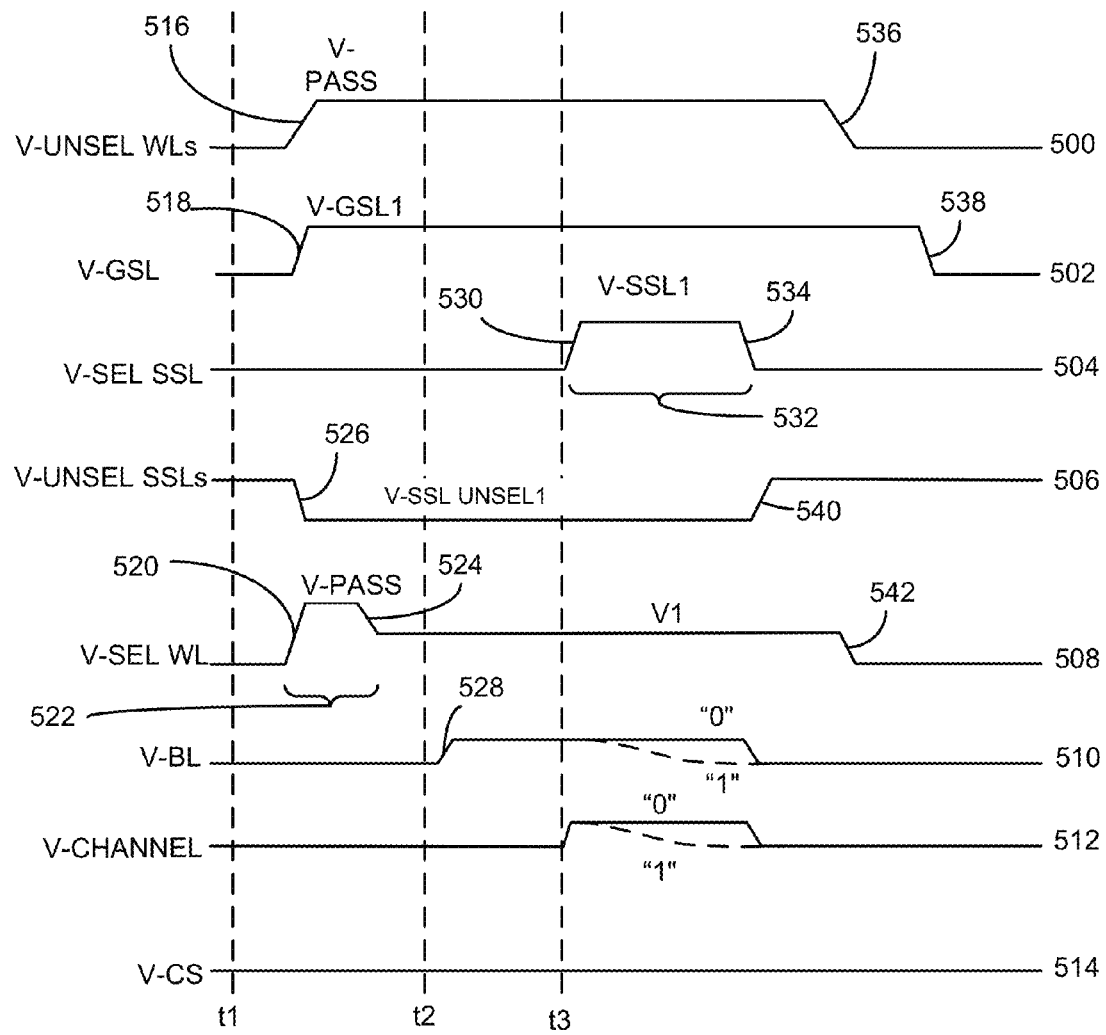
FIG. 5 is an alternative biasing arrangement timing diagram.

FIG. 5 is an alternative biasing arrangement timing diagram. The timing diagram includes a first interval between t1 and t2, a second interval between t2 and t3 and a third interval after t3.

The track of the voltage level on V-UNSEL WLs is represented by line 500 in the timing diagram. The track of the voltage level on V-GSL is represented by line 502. The track of the voltage level on V-SEL SSL is represented by line 504. The track of the voltage level on V-UNSEL SSLs is represented by line 506. The track of the voltage level on V-SEL WL is represented by line 508. The track of the voltage level of V-BL is represented by line 510. The track of the voltage level on V-CHANNEL is represented by line 512. The track of the voltage level of V-CS is represented by line 514.

During the first interval, V-UNSEL WLs is transitioned at 516 to a V-PASS voltage. V-UNSEL WLs remains at the V-PASS voltage level for the remainder of the first interval, the duration of the second interval and into a portion of the third interval. Also during the first interval, V-GSL is transitioned at 518 to V-GSL1. V-GSL remains at V-GSL1 for the remainder of the first interval, the duration of the second interval, and into a portion of the third interval. V-SEL SSL remains at a constant low voltage level throughout the durations of both the first and second intervals. Both V-BL and V-CS remain at a constant low voltage level through the duration of the first interval.

Additionally, during the first interval, V-SEL WL is transitioned at 520 to V-PASS for a portion 522 of the duration of the first interval. After such portion 522, V-SEL WL is transitioned at 524 to V1. V-SEL WL remains at V-RD for the remaining portion of the duration of the first interval after portion 522 and for the entire duration of the second interval. V-UNSEL SSLs is transitioned at 526 to V-SSL UNSEL1. V-UNSEL SSLs remains at V-SSL UNSEL1 for the remaining portion of the duration of the first interval after transition 526 and the entire duration of the second interval. During the second interval, V-BL is transitioned at 528 to a setup voltage so that the threshold voltage of the selected memory cell can be determined during the third interval.

During the third interval, V-SEL SSL is transitioned at 530 to V-SSL1 for a portion 532 of the duration of the third interval. The transition at 530 causes the selected NAND string to become coupled to the sensing node. Additionally, the transition at 530 causes V-CHANNEL to increase, during the third interval, to the setup voltage level of V-BL. V-CHANNEL then either remains at the setup voltage level or decreases based upon the threshold voltage level of the selected cell. The portion 532 of the duration of the third interval is long enough so that V-BL either changes or does not change in response to the logic level of the data that is stored in the selected memory cell. After the portion 532 of the duration of the third interval, V-SEL SSL can be transitioned at 534 back to a low voltage level. Additionally, after the portion 532 of the duration of the third interval, V-UNSEL WLs and V-GSL can all be transitioned at 536 and 538 back to a low voltage level, such as the voltage level on V-UNSEL WLs and V-GSL at the beginning of the first interval. V-UNSEL SSLs is transitioned at 540 from V-SSL UNSEL1 back to the same voltage level on V-UNSEL SSLs at the beginning of the first interval. Transition 540 occurs after the portion 532 of the duration of the third interval. After V-BL responds according to the logic level of the data that is stored in the selected memory cell, V-SEL WL can be transitioned at 542 back to a low voltage level.

The transition of V-SEL WL at 520 to V-PASS allows current to flow through the entire semiconductor body regions of both the selected and unselected NAND strings that share the same word lines and common source line and have ground select switches that are coupled to the same ground select line. Specifically, this occurs because V-PASS is applied to all of the cells in the selected and unselected strings for a duration of the first interval. The transition at 518 of V-GSL to the V-GSL1 voltage closes the ground select switches of the selected and unselected NAND strings. As a result, the semiconductor body regions of the selected and unselected NAND strings under the memory cells on both sides of the memory cells that share the selected word line are coupled to a reference voltage, the voltage V-CS, during the first interval. Therefore, the semiconductor body regions under such memory cells in the unselected and selected NAND strings are not left floating, so that self-induced capacitive boosting is limited.

Figure 6:
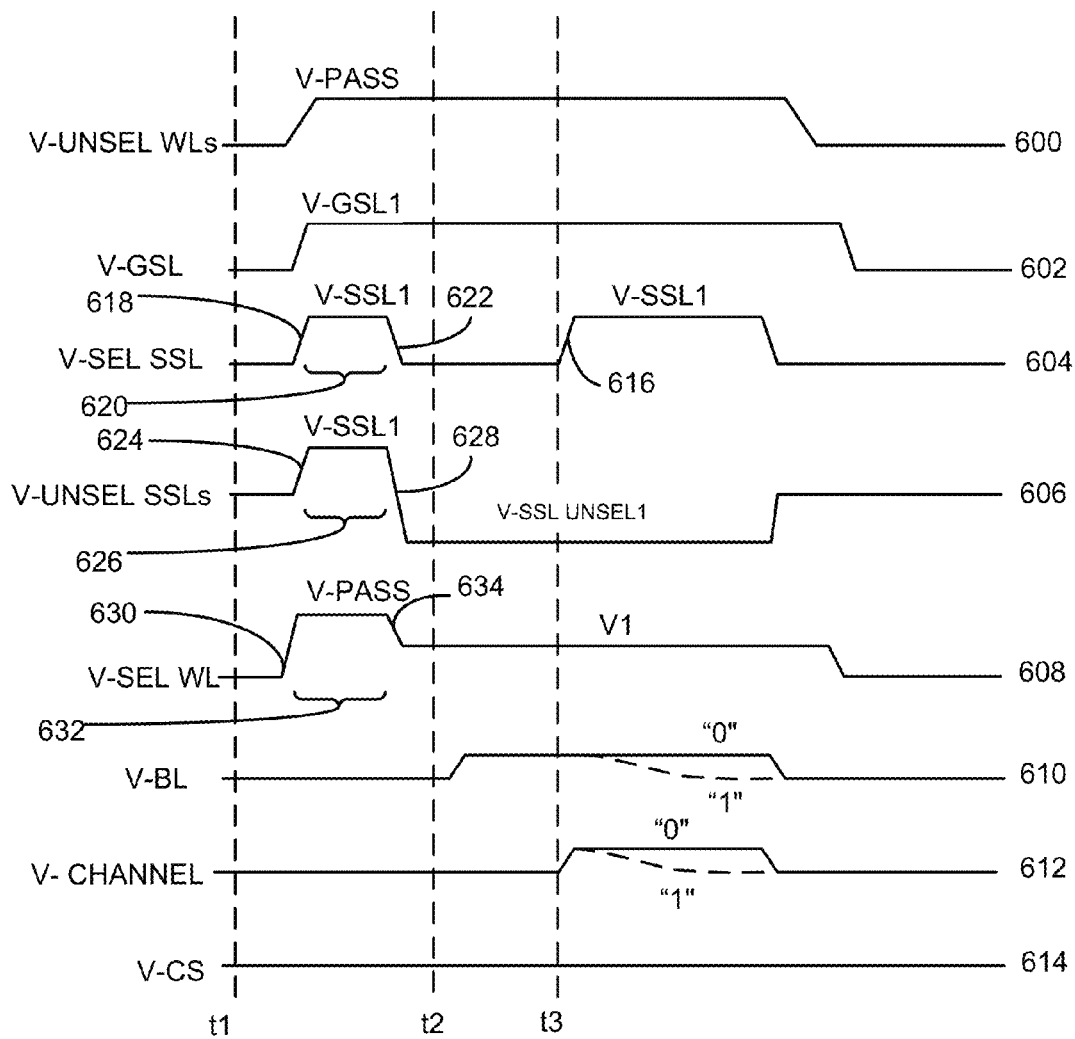
FIG. 6 is another alternative biasing arrangement timing diagram.

FIG. 6 is another alternative biasing arrangement timing diagram. The bias arrangement timing diagram includes the same first interval between t1 and t2, second interval between t2 and t3, and third interval after t3, as the previously described biasing arrangement timing diagrams.

The track of the voltage level on V-UNSEL WLs is represented by line 600 in the timing diagram. The track of the voltage level on V-GSL is represented by line 602. The track of the voltage level on V-SEL SSL is represented by line 604. The track of the voltage level on V-UNSEL SSLs is represented by line 606. The track of the voltage level on V-SEL WL is represented by line 608. The track of the voltage level on V-BL is represented by line 610. The track of the voltage level on V-CHANNEL, is represented by line 612. The track of the voltage level on V-CS is represented by line 614.

As with the previously shown bias arrangements, V-UNSEL WLs is transitioned to V-PASS during the first interval and remains at the V-PASS voltage level into the third interval. Also, V-GSL is transitioned to V-GSL1 during the first interval and remains at the V-GSL1 voltage level into the sensing interval. V-BL is transitioned during the second interval to the setup voltage level and then either changes or does not change corresponding to the logic value of the data that is stored in the selected memory cell after V-SEL SSL is transitioned at 616 to V-SSL1 during the third interval. Additionally, the transition of V-SEL SSL at 616 causes V-CHANNEL to increase, during the third interval, to the setup voltage level on V-BL. V-CHANNEL then either remains at the setup voltage level or decreases based upon the threshold voltage level of the selected cell. Furthermore, throughout the shown biasing arrangement timing, V-CS is kept at a constant reference voltage level (e.g. ground).

As with the biasing arrangement shown in FIGS. 3B and 4, V-SEL SSL is transitioned at 618 to V-SSL1 for a portion 620 of the duration of the first interval. After such portion 620 of the duration of the first interval, V-SEL SSL is transitioned at 622 back to a low voltage level. The transition at 622 can occur either during the first interval, or during the second interval before V-BL is transitioned to a setup voltage level. Additionally during the first interval, V-UNSEL SSLs are transitioned at 624 to V-SSL1 for a portion 626 of the duration of the first interval. The portion 626 of the duration of the first interval can be the same as the portion 620 of the duration of the first interval during which V-SEL SSL is at voltage level V-SSL1. After the portion 626 of the duration of the first interval, V-UNSEL SSLs are transitioned at 628 to a V-SSL UNSEL1 voltage. The transition at 628 can occur during the second interval before V-BL is transitioned to a setup voltage. V-UNSEL SSLs are kept at the V-SSL UNSEL1 voltage level into the third interval until after the threshold voltage level of the selected memory cell is determined.

As with the biasing arrangement that is shown in FIG. 5, V-SEL WL is transitioned at 630 to V-PASS voltage level for a portion 632 of the duration of the first interval. After the portion 632 of the duration of the first interval, V-PASS is transitioned at 634 to V1. Transition 634 can occur during the second interval before the bit line is transitioned to a setup voltage. V-SEL remains at the V1 voltage level into the third interval until after the logic value of the selected memory cell is determined.

The transition of V-SEL SSL and V-UNSEL SSLs to V-SSL1 at transitions 618 and 624 causes the string select switches of the selected and unselected strings to be closed so that the selected and unselected strings are coupled to the sensing node, during the portions 620 and 626 of the first interval. Additionally, the selected and unselected NAND strings are coupled to the common source line with a V-CS voltage during the first interval through the transitioning of V-GSL to V-GSL1 voltage so that the ground select switches of the selected and unselected strings are closed. Furthermore, the transition of V-UNSEL WLs and V-SEL WL to a V-PASS voltage allows current to flow through all of the memory cells in the selected and unselected NAND strings. As a result, the semiconductor body regions under the memory cells in the selected and unselected strings on both sides of the memory cells that are coupled to the selected word line are coupled to a reference voltage and not left floating.

Figure 7:
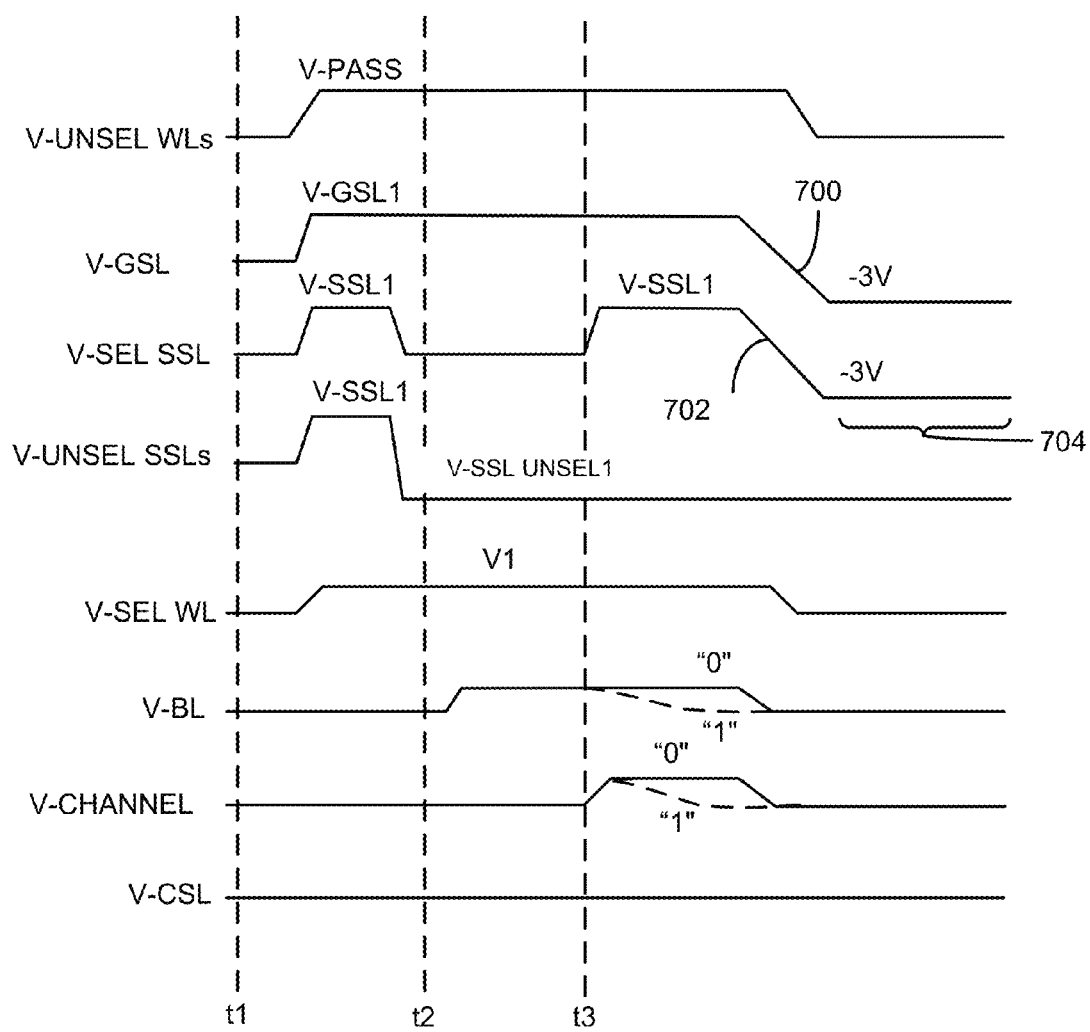
FIG. 7 is another alternative biasing arrangement timing diagram.

FIG. 7 is another alternative biasing arrangement timing diagram. The biasing arrangement timing diagram shown in FIG. 7 is like the biasing arrangement timing diagram shown in FIGS. 3B and 4, so that the same benefits as described in the accompanying description to FIGS. 3B and 4 are achieved. However, as shown in FIG. 7, V-GSL and V-SEL SSL are transitioned at 700 and 702 from voltages of V-GSL1 and V-SSL1, to voltages below the voltages on V-GSL and V-SEL SSL at the beginning of the first interval. Such low voltage level ensures that the string select and ground selected switches are open even when the threshold voltage level of the switches is less than 0V. The low voltages on V-GSL and V-SEL SSL after 700 and 702 can be maintained for a portion 704 of the duration of the third interval, after t3. An example voltage level of V-GSL and V-SEL SSL after points 700 and 702 can be −3V. Furthermore, the same biasing arrangement during the third interval that is shown in FIG. 7 can also be applied to the biasing arrangement timing diagrams that are shown in FIGS. 5 and 6.

Figure 8:
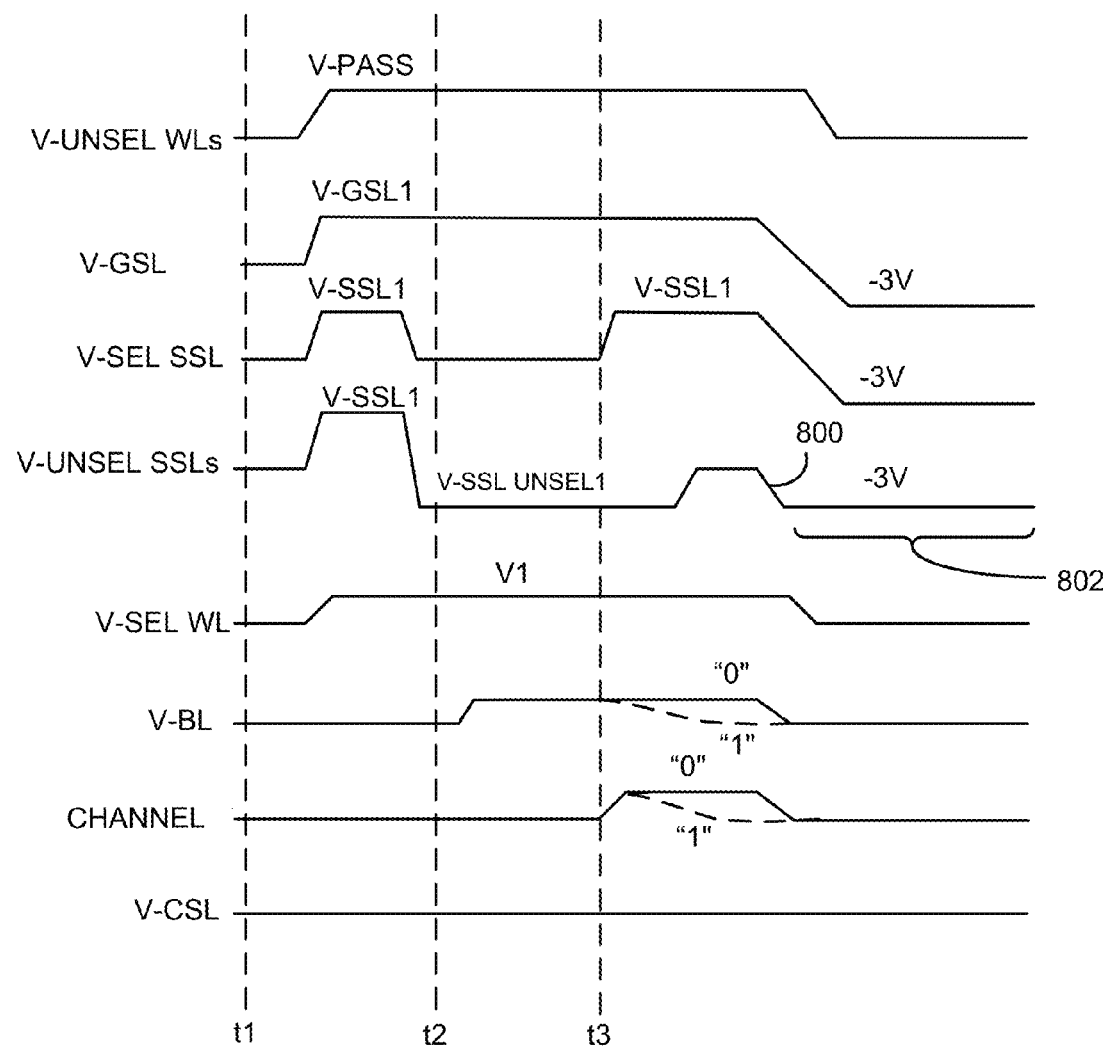
FIG. 8 is another alternative biasing arrangement timing diagram.

FIG. 8 is another alternative biasing arrangement timing diagram. The biasing arrangement timing diagram shown in FIG. 8 is like the biasing arrangement timing diagram shown in FIGS. 3B and 4. Additionally, the biasing arrangement that is applied during the third interval, after t3, is the same for V-GSL and V-SEL SSL as it is in FIG. 7. However, under the bias scheme shown in FIG. 8, V-UNSEL SSLs transitions at 800 to a voltage level that is less than the voltage level of the voltage on V-UNSEL SSLs at the beginning of the first interval, at time t1. As with the biasing arrangement shown in FIG. 7, the transition to this voltage ensures that the string select switches of the unselected strings are open even when the string select switches have a threshold voltage level that is less than 0V. The low voltage level is maintained on V-UNSEL SSLs for a portion 802 of the third interval. An example voltage level of the voltage to which V-UNSEL SSLs is transitioned at 800 can be −3V. Furthermore, the same biasing arrangement during the third interval that is shown in FIG. 8 can also be applied to the biasing arrangement timing diagrams that are shown in FIGS. 5 and 6.

Figure 9:
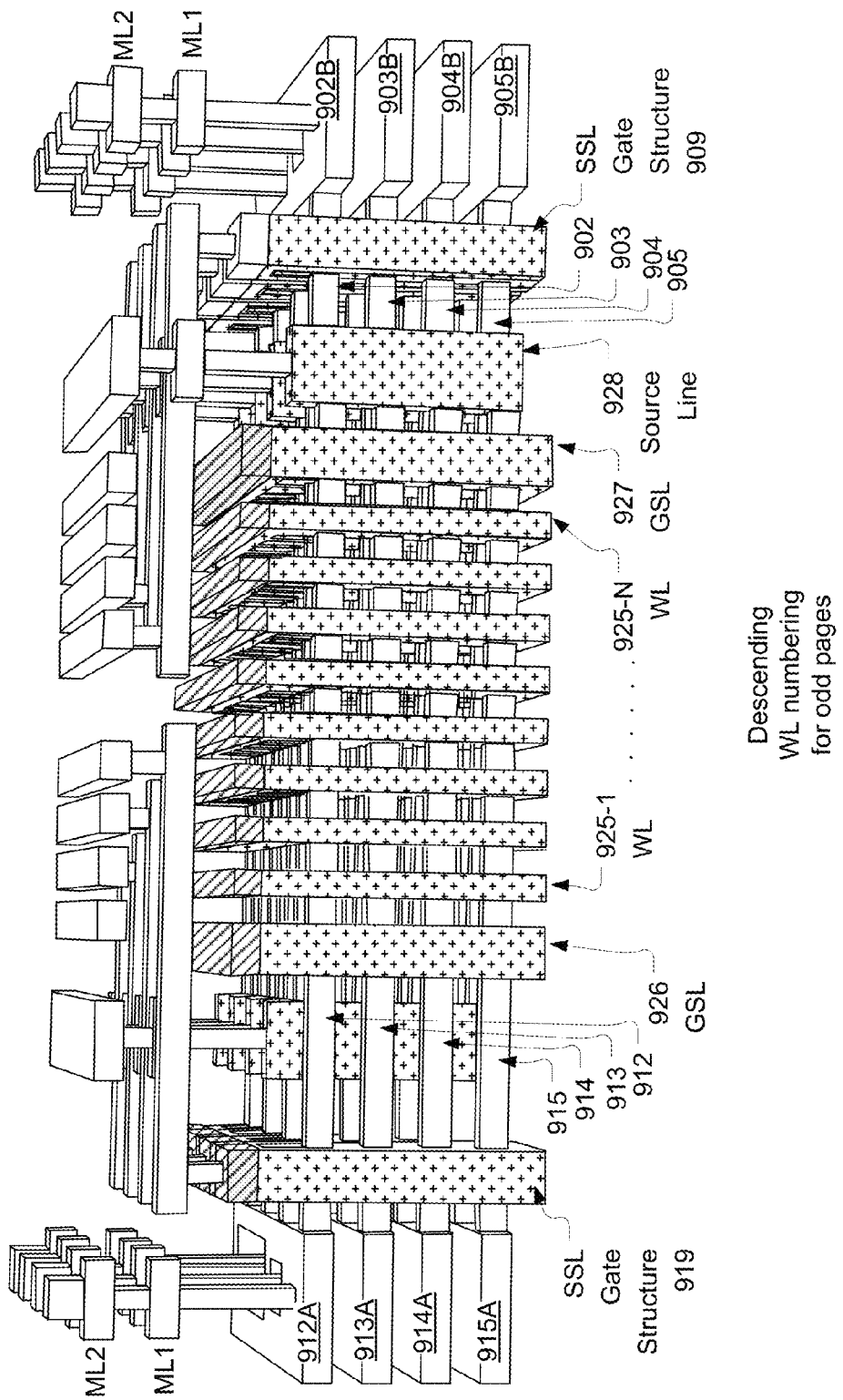
FIG. 9 is an illustration of an example 3D NAND memory array structure that can have the various biasing arrangements and timing schemes discussed herein applied to it.

FIG. 9 is an example illustration of a 3D NAND memory array structure with successively higher metal layers of string select lines with a lengthwise orientation parallel to the semiconductor material strips, string select lines with a widthwise orientation parallel to the word lines, and bit lines with a lengthwise orientation parallel to the semiconductor material strips. As the semiconductor material strips are all coupled to the same word lines, the problems of self-induced capacitive boosting in the NAND strings formed by such semiconductor material strips are realized under the biasing schemes. The various biasing schemes shown in FIGS. 3-8 can be applied in performing an operation on the memory cell of the 3D NAND memory array structure shown in FIG. 9, so that the semiconductor body regions under the memory cells of the multiple NAND strings in the array are coupled to a reference voltage and not left floating.

The multilayer array is formed on an insulating layer, and includes a plurality of word lines 925-1, ..., 925-n−1, 925-n conformal with the plurality of ridge-shaped stacks, and which act as word lines WLn, WLn−1, ... WL1. The plurality of ridge-shaped stacks includes semiconductor strips 912, 913, 914, 915. Semiconductor strips in the same plane are electrically coupled together by stairstep structures.

Stairstep structures 912A, 913A, 914A, 915A terminate semiconductor strips, such as semiconductor strips 912, 913, 914, 915. As illustrated, these stairstep structures 912A, 913A, 914A, 915A are electrically connected to different bit lines for connection to decoding circuitry to select planes within the array. These stairstep structures 912A, 913A, 914A, 915A can be patterned at the same time that the plurality of ridge-shaped stacks are defined.

Stairstep structures 902B, 903B, 904B, 905B terminate semiconductor strips, such as semiconductor strips 902, 903, 904, 905. As illustrated, these stairstep structures 902B, 903B, 904B, 905B are electrically connected to different bit lines for connection to decoding circuitry to select planes within the array. These stairstep structures 902B, 903B, 904B, 905B can be patterned at the same time that the plurality of ridge-shaped stacks are defined.

Any given stack of semiconductor strips is coupled to either the stairstep structures 912A, 913A, 914A, 915A, or the stairstep structures 902B, 903B, 904B, 905B, but not both. A stack of semiconductor strips has one of the two opposite orientations of bit line end-to-source line end orientation, or source line end-to-bit line end orientation. For example, the stack of semiconductor strips 912, 913, 914, 915 has bit line end-to-source line end orientation; and the stack of semiconductor strips 902, 903, 904, 905 has source line end-to-bit line end orientation.

The stack of semiconductor strips 912, 913, 914, 915 is terminated at one end by the stairstep structures 912A, 913A, 914A, 915A, passes through SSL gate structure 919, GSL 926, word lines 925-1 WL through 925-N WL, GSL 927, and is terminated at the other end by source line 928. The stack of semiconductor strips 912, 913, 914, 915 does not reach the stairstep structures 902B, 903B, 904B, 905B.

The stack of semiconductor strips 902, 903, 904, 905 is terminated at one end by the stairstep structures 902B, 903B, 904B, 905B, passes through SSL gate structure 909, GSL 927, word lines 925-N WL through 925-1 WL, GSL 926, and is terminated at the other end by a source line (obscured by other parts of figure). The stack of semiconductor strips 902, 903, 904, 905 does not reach the stairstep structures 912A, 913A, 914A, 915A.

A layer of memory material separates the word lines 925-1 through 925-n, from the semiconductor strips 912-915 and 902-905. Ground select lines GSL 926 and GSL 927 are conformal with the plurality of ridge-shaped stacks, similar to the word lines.

Every stack of semiconductor strips is terminated at one end by stairstep structures, and at the other end by a source line. For example, the stack of semiconductor strips 912, 913, 914, 915 is terminated at one end by stairstep structures 912A, 913A, 914A, 915A, and terminated on the other end by source line 928. At the near end of the figure, every other stack of semiconductor strips is terminated by the stairstep structures 902B, 903B, 904B, 905B; and every other stack of semiconductor strips is terminated by a separate source line. At the far end of the figure, every other stack of semiconductor strips is terminated by the stairstep structures 912A, 913A, 914A, 915A; and every other stack of semiconductor strips is terminated by a separate source line.

Bit lines and string select lines are formed at the metals layers ML1, ML2, and ML3.

Transistors are formed between the stairstep structures 912A, 913A, 914A and the word line 925-1. In the transistors, the semiconductor strip (e.g. 913) acts as the channel region of the device. SSL gate structures (e.g. 919, 909) are patterned during the same step that the word lines 925-1 through 925-n are defined. A layer of silicide can be formed along the top surface of the word lines, the ground select lines, and over the gate structures. The dielectric that is used as a memory element can act as the gate dielectric for the transistors. These transistors act as string select gates coupled to decoding circuitry for selecting particular ridge-shaped stacks in the array.

A first metal layer ML1 includes string select lines with a lengthwise orientation parallel to the semiconductor material strips. These ML1 string select lines are connected by short vias to different SSL gate structures (e.g., 909, 919). A second metal layer ML2 includes string select lines with a widthwise orientation parallel to the word lines. These ML2 string select lines are connected by short vias to different ML1 string select lines. In combination, these ML1 string select lines and ML2 string select lines allow a string select line signal to select a particular stack of semiconductor strips.

The first metal layer ML1 also includes two source lines with a widthwise orientation parallel to the word lines. Such source lines can serve as reference nodes so that there is a plurality of reference nodes in the array.

Different bit lines are electrically connected to different steps of the stairstep structures 912A, 913A, 914A, 915A and 902B, 903B, 904B, 905B. Such bit lines can serve as a plurality of sensing nodes in the 3D array of NAND strings. These bit lines allow a bit line signal to select a particular horizontal plane of semiconductor strips.

Because a particular word line allows a word line to select a particular row plane of memory cells, the threefold combination of word line signals, bit line signals, and string select line signals is sufficient to select a particular memory cell from the 3D array of memory cells.

Figure 10:
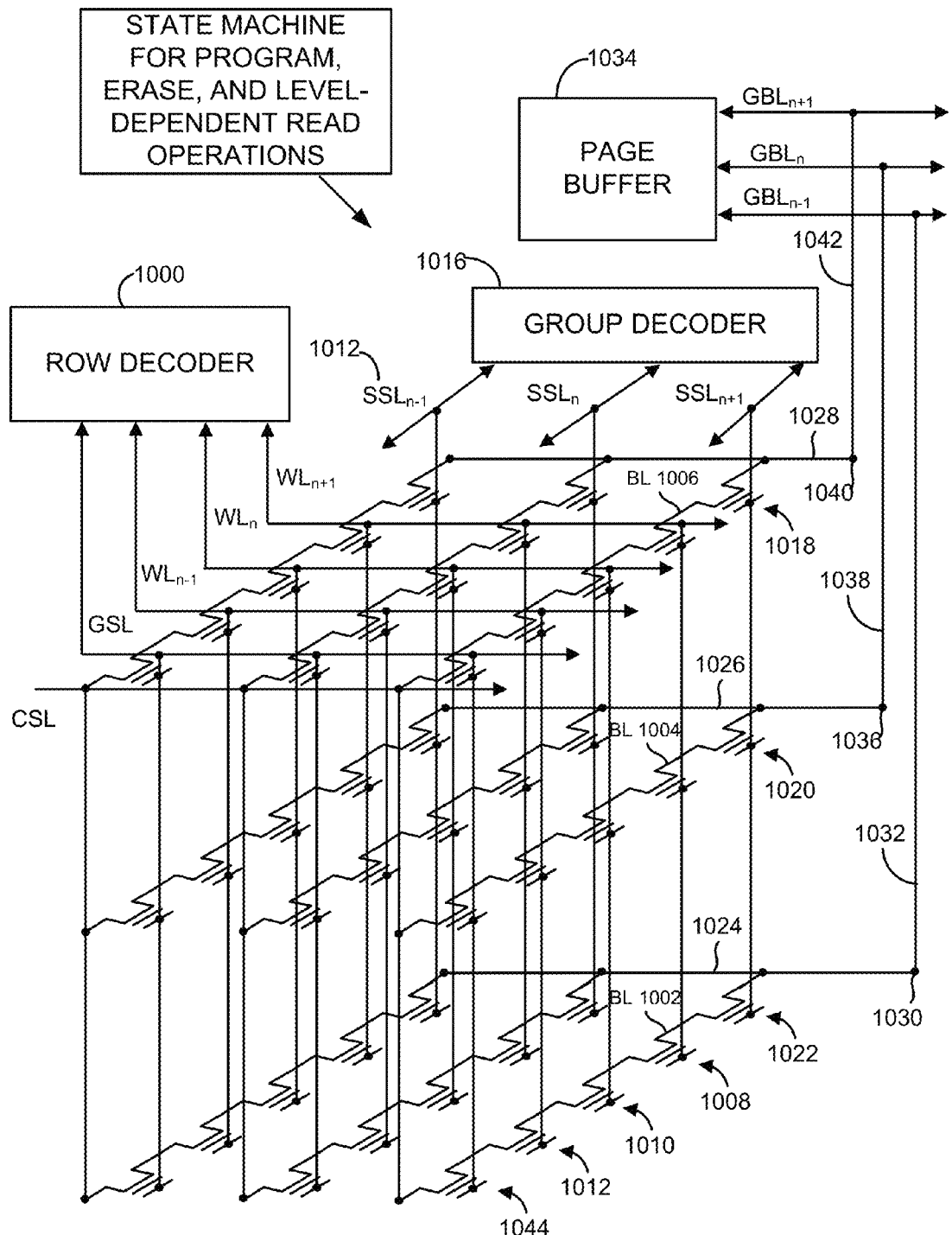
FIG. 10 is a schematic diagram of a portion of a memory array used to illustrate the three levels of memory cells of a block of memory cells of the 3D NAND memory array structure shown in FIG. 9.

FIG. 10 is a schematic diagram of a portion of a memory array illustrating the three levels of memory cells of a block of memory cells of the 3D NAND memory array structure shown in FIG. 9. For purposes of clarity, the interleaved structure of NAND strings that is shown in FIG. 9 is omitted from FIG. 10. A plurality of word lines including word lines WLn−1, WLn, WLn+1 extend in parallel along a direction. The word lines are in electrical communication with row decoder 1000. The word lines are connected to the gates of the memory cells, which are arranged in series as NAND strings. Word line WLn is representative of the word lines. The word line WLn is vertically connected to the gates of the memory cells in each of the various levels underlying the word line WLn.

A plurality of local bit lines are arranged along columns to form a stack of NAND strings in the various levels of the memory array. The array includes a local bit line BL 1002 on the third level, a local bit line BL 1004 on the second level, and local bit line BL 1006 on the first level. Such bit lines can act as the sensing nodes during operations that are performed on the memory cells in the corresponding NAND strings. The memory cells have dielectric charge trapping structures between the corresponding word lines and the corresponding local bit lines. In this illustration, there are three memory cells in a NAND string for simplicity. For example, a NAND string formed by local bit line BL 1002 on the third level comprises memory cells 1008, 1010 and 1012. In a typical implementation, a NAND string may comprise 16, 32 or more memory cells.

A plurality of string select lines including string select lines SSLn−1, SSln, SSln+1 are in electrical communication with group decoder 1016 (which could be part of the row decoder 1000), which selects a group of strings. The string select lines are connected to the gates of string select transistors arranged at the first ends of the memory cell NAND strings. Each of the string select lines is vertically connected to the gates of a column of the string select transistors in each of the various levels. For example, string select line SSLn+1 is connected to the gates of string select transistors 1018, 1020 and 1022 in the three levels.

The local bit lines on a particular level are selectively coupled to an extension on the particular level by the corresponding string select transistors. For example, the local bit lines on the third level are selectively coupled to extension 1024 by the corresponding string select transistors in that level. Similarly, the local bit lines on the second level are selectively coupled to extension 1026, and local bit lines on the first level are selectively coupled to extension 1028.

The extensions on each of the levels include a corresponding contact pad for contact with a vertical connector coupled to a corresponding global bit line. For example, extension 1024 in the third level is coupled to a global bit line GBLn−1 via contact pad 1030 and vertical connector 1032. Extension 1026 on the second level is coupled to a global bit line GBLn via contact pad 1036 and vertical connector 1038. Extension 1028 on the first level is coupled to a global bit line GBLn+1 via contact pad 1040 and vertical connector 1042.

The global bit lines GBLn−1, GBLn, and GBLn+1 are coupled to additional blocks (not shown) in the array and extend to page buffer 1034. In this manner a 3D decoding network is established, in which a page of selected memory cells is accessed using one word line, all or some of the bit lines and one string select line.

Block select transistors are arranged at the second ends of the NAND strings. The block select transistors can have the same gate dielectric structure as the memory cells that form the NAND strings. Block select transistor 1044 is arranged at the second end of the NAND string formed by memory cells 1008, 1010 and 1012. A ground select line GSL is connected to the gates of the block select transistors. The ground select line GSL is in electrical communication with the row decoder 1000 to receive bias voltages during operations. Such operations can include the various biasing arrangements and timing schemes that prevent self-induced boosting as are described herein.

The block select transistors are used to selectively couple second ends of all the NAND strings in the block to a reference voltage provided on a common source line CSL. The common source line CSL receives bias voltages from the bias circuit (not shown) during operations. The CSL can act as the reference node during operations performed on the memory cells in the corresponding NAND strings. In some operations, the CSL is biased to a reference voltage that is higher than that of a bit line coupled to the opposite end of a NAND string, rather than in the more traditional "source" role at or near ground.

The various bias arrangements described in the present specification can be applied to the portion of the memory array of stacks of NAND strings that is shown schematically in FIG. 10. Specifically, in one embodiment, in determined the threshold voltage level of memory cell 1010 that is part of the NAND string that is formed by local bit line 1002, the voltage on $SSL_{n+1}$ is transitioned to V-SSL1, for a portion of the duration of time of a first bias interval. This causes the string select transistor 1022 to close, so that the NAND string that is formed by local bit line 1002 is directly coupled to $GBL_{n-1}$. $GBL_{n-1}$ is set at a reference voltage (e.g. ground) for the portion of the duration of time during the first bias interval in which $SSL_{n+1}$ is at V-SSL1. Furthermore, during such first interval the voltage on GSL is transitioned to V-GSL1, so that block select transistor 1044 is closed, such that the NAND string that is formed by local bit line 1002 is directly coupled to CSL. As a result, the semiconductor body regions under both sides of the selected memory cell 1010 are coupled to a reference voltage and thus not left floating as is consistent with the variously described embodiments.

The NAND strings formed by local bit lines 1004 and 1006 are coupled to both the same CSL through block select transistors that are coupled to the same GSL as block select transistor 1044. Additionally, such NAND strings are coupled to the same SSLn+1 through string select transistors 1018 and 1020. As a result, the semiconductor body regions in the NAND strings formed by local bit lines 1004 and 1006 are also coupled to a reference voltage and not left floating.

Additionally, during a portion of the duration of time during the first bias interval the voltage on SSLn and SSLn−1 can be transitioned to V-SSL1, while GBLn and GBLn−1 are kept at a reference voltage (e.g. ground). As a result, the semiconductor body regions in all of the unselected NAND strings in the stacks of NAND strings that are coupled to both the SSLn and SSLn−1 lines and to the CSL through block select transistors with gates that are coupled to GSL, are coupled to a reference voltage and not left floating.

In another embodiment, in determining the threshold voltage level of memory cell 1010, the voltage on WLn is transitioned to V-PASS for a portion of the duration of the first bias interval, as is shown in FIG. 5. Additionally, the voltages on WLn−1 and WLn+1 are also transitioned to V-PASS during the first interval. The voltage on GSL is transitioned to V-GSL1, so that the block select transistors of all of the shown NAND strings are closed. As a result, all of the shown NAND strings are directly coupled to CSL, including the NAND string formed by local bit line 1002. As a result, the portions of the semiconductor body regions under memory cells on both sides of the selected memory cell 1010 in the NAND string are all coupled to the reference voltage that exists on the CSL. Additionally, as all of the shown NAND strings are coupled to the same word lines and the block select transistors of such NAND strings are coupled to the same GSL, such biasing arrangement causes the semiconductor body regions of the remaining unselected NAND string to be coupled to a reference voltage and not left floating.

In another embodiment, the previously discussed biasing arrangements can be combined. Through such combination, in determining the threshold voltage level of memory cell 1010, the voltage on $WL_n$ is transitioned to V-PASS for a portion of the duration of the first bias interval. Also, the voltage on $SSL_{n+1}$ is transitioned to V-SSL1, for another portion of a duration of time during the first bias interval, causing the string select transistor 1022 to close. As a result, the NAND string formed by local bit line 1002 is directly coupled to $GBL_{n-1}$. Such durations of time during which $WL_n$ is transitioned to V-PASS and the voltage on $SSL_{n+1}$ is transitioned to V-SSL1 can be different, the same or overlap. The voltage on $SSL_{n+1}$ is transitioned to V-SSL1 for a portion of the duration of the first interval while the voltage on $GBL_{n-1}$ is set at a reference voltage (e.g. ground). As a result of the transitioning of the voltage on $SSL_{n+1}$ to V-SSL1 and of the transitioning of the voltage on $WL_n$ to V-PASS, the semiconductor body regions under the memory cells on both sides of the selected memory cell in the NAND string formed by local bit line 1006 are coupled to a reference voltage and not left floating. Additionally, the voltages on $SSL_{n-1}$ and $SSL_n$ that are coupled to stacks of NAND strings with unselected NAND strings, can be transitioned to V-SSL1 for a portion of a duration of the first interval, so that the semiconductor body regions in such unselected NAND strings are coupled to a reference voltage while the voltages on the unselected word lines are transitioned to V-PASS.

Figure 11:
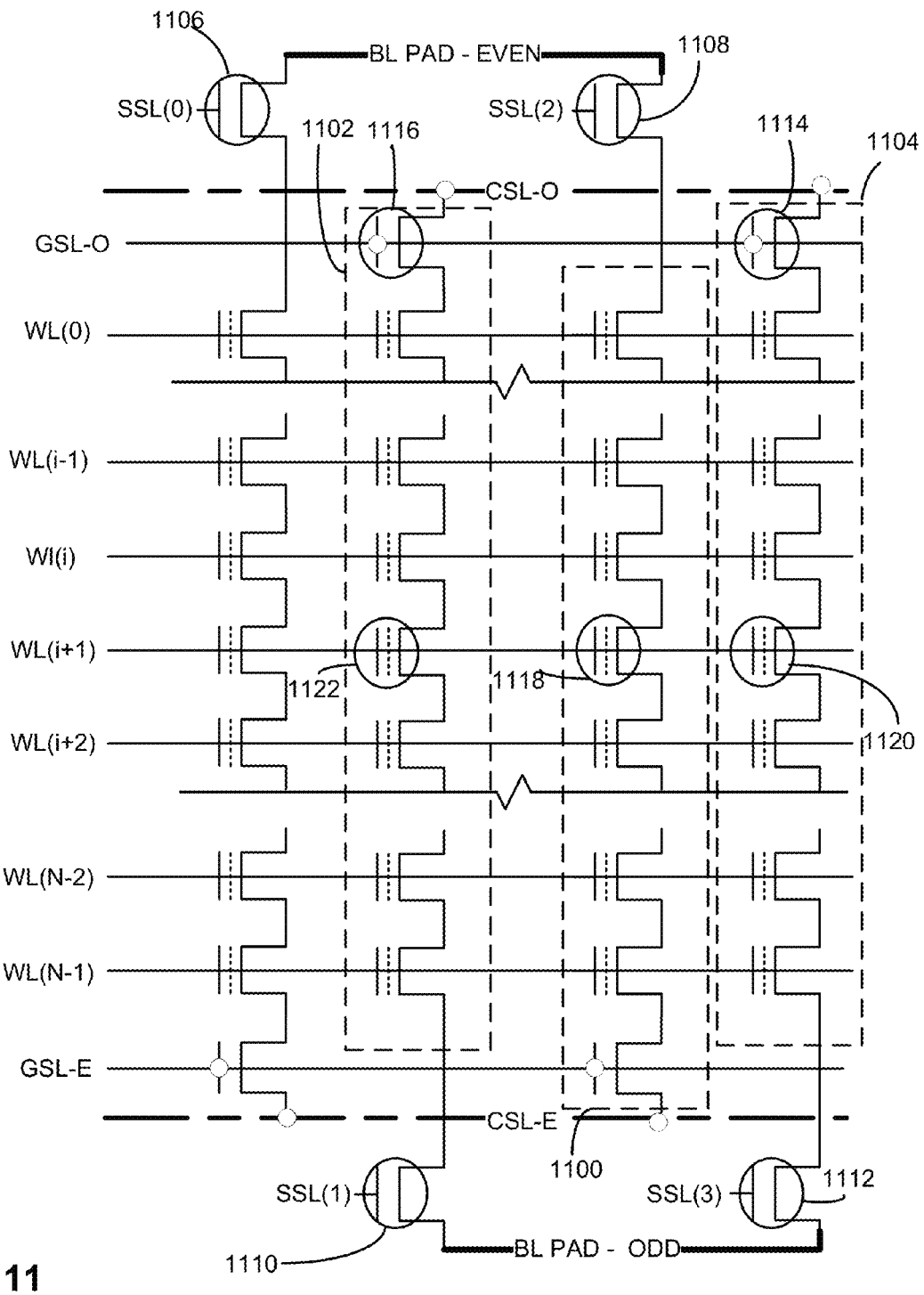
FIG. 11 is a simplified circuit diagram of the interleaved string configuration of a portion of a level of memory cells of the 3D NAND memory array structure shown in FIG. 9.

FIG. 11 is a simplified circuit diagram of an interleaved string configuration of a portion of a level of memory cells of the 3D NAND memory array structure shown in FIG. 9. As the interleaved strings are coupled the same word lines, the problems of self-induced capacitive boosting can affect the interleaved strings. The various bias arrangements and corresponding timing schemes described in this application can be applied to the portion of the level of memory cells shown in the circuit diagram in FIG. 11. The interleaved string configuration is created by the strings 1102 and 1104 that are adjacent to string 1100, which are coupled to a different bit line pad than the bit line pad coupled to string 1100. The bit line pads can serve as either the sensing node or reference node. Specifically, strings 1102 and 1104 are coupled to BL PAD-ODD while string 1100 is coupled to BL PAD-EVEN. All of the strings that are coupled to one of the corresponding bit line pads form a page of memory cells in the 3D array. The strings are coupled to corresponding bit line pads through string select switches 1106, 1108, 1110 and 1112. The string select switches 1106, 1108, 1110 and 1112 are coupled to corresponding string select lines SSL(0), SSL(1), SSL(2) and SSL (3). Through such string select switches, each NAND string in the interleaved string configuration can be individually selected and have operations performed on it.

The strings that are coupled to the same bit line pad are coupled to a common source line through corresponding ground select switches for each NAND string. The corresponding ground select switches for each NAND string are coupled to a ground select line. For example, strings 1102 and 1104 that are coupled to BL PAD-ODD are coupled through ground select switches 1114 and 1116 to CSL-O. The ground select switches are coupled to GSL-O, such that during operations, a voltage can be applied to GSL-O so that the ground select switches 1114 and 1116 are closed, and NAND strings 1102 and 1104 are directly coupled to CSL-O.

The memory cells of the NAND strings in the shown portion of the level of the array are coupled to word lines WL(0)-WL(N−1) such that rows of memory cells are created within the array from the NAND strings. Specifically, the adjacent memory cells in the adjacent NAND strings share the same word line. For example, memory cell 1118 in NAND string 1100 shares the same word line WL(i+1) as memory cells 1120 and 1122 in adjacent NAND strings 1102 and 1104.

As multiple NAND strings share word lines, bit line pads and common source lines in the 3D configurations, the problems observed through the biasing arrangement can also occur in unselected NAND strings that are coupled to the same word lines, bit line pads and common source lines as the selected NAND string. As such, self-induced capacitive boosting caused by floating semiconductor body regions in unselected NAND strings occurs. Such boosting can lead to unwanted charge tunneling into the memory cells of an unselected NAND string.

The bias arrangements described in the present specification can be applied to the portion of the memory array of adjacent interleaved NAND strings in a level of the different stacks of strings that is shown schematically in FIG. 11. Specifically, in determining the threshold voltage level in memory cell 1120 of NAND string 1104, the voltage on SSL(3) can be transitioned to V-SSL1 for a portion of the duration of a first interval of a bias arrangement such that string select switch 1112 is closed and NAND string 1104 is directly coupled to the BL PAD-ODD. During such duration of the portion of the first interval when the voltage on SSL(3) is transitioned, the BL PAD-ODD is set at a reference voltage. Additionally, during the first interval, the voltage on GSL-O is transitioned to GSL1 so that the ground select switches 1114 and 1116 of corresponding NAND strings 1102 and 1104 are closed. As such, NAND strings 1102 and 1104 are coupled directly to the CSL-O. Therefore, the semiconductor body regions under the memory cells on both sides of the memory cell 1120 in the NAND string 1104 are coupled to a reference voltage and not left floating.

The voltage on the unselected string line SSL(1) of the unselected NAND string 1102 can be transitioned to V-SSL1 for a portion of the duration of the first interval. As a result, the string select switch 1110 is closed and the unselected NAND string is directly coupled to BL PAD-ODD during such portion of the duration of the first interval. The ground select switch 1116 of the unselected NAND string 1102 is coupled to the same GSL-O as the ground select switch 1114 of the selected NAND string 1104 and is thus closed as ground select switch 1114 is also closed. As a result, the portions of the semiconductor body regions under the memory cells in the unselected NAND string 1102 are coupled to a reference voltage and not left floating.

In an alternative embodiment, the voltage on WL(i+1) that is coupled to memory cell 1120 can be transitioned to V-PASS during a portion of the duration of the first interval. As such, current can flow throughout the semiconductor body region of the selected NAND string 1104. As current can flow through the semiconductor body region of the selected NAND string 1104, and as the voltage on GSL-O is transitioned to V-GSL1, all of the portions of the semiconductor body regions of the memory cells in the selected NAND string 1104 are coupled to the reference voltage on the CSL-O and not left floating. Additionally, as the unselected NAND string 1102 is coupled to the same word lines and has a ground select switch 1116 that is coupled to the same GSL-O as the selected NAND string 1104, such bias arrangement causes the entire semiconductor body region of the unselected NAND string 1102 to be coupled to a reference voltage and thus not left floating.

In an alternative embodiment, the previously described biasing arrangements can be combined. Specifically, the voltage on the word line that is coupled to the selected memory cell can be transitioned to a V-PASS voltage level for a portion of the duration of the first interval and the voltages on SSL(1) and SSL(3) can either individually or both be transitioned to V-SSL1 for a portion of the duration of the first interval so that all the portions of the semiconductor body regions of both the selected and unselected NAND string are coupled to one of either BL PAD-EVEN or BL PAD-ODD are coupled to a reference voltage and not left floating.

Additionally, all of the previously described biasing schemes can be applied to the NAND strings that are coupled to the BL PAD that is not the BL PAD to which the selected NAND string is coupled in the interleaved structure.

Figure 12:
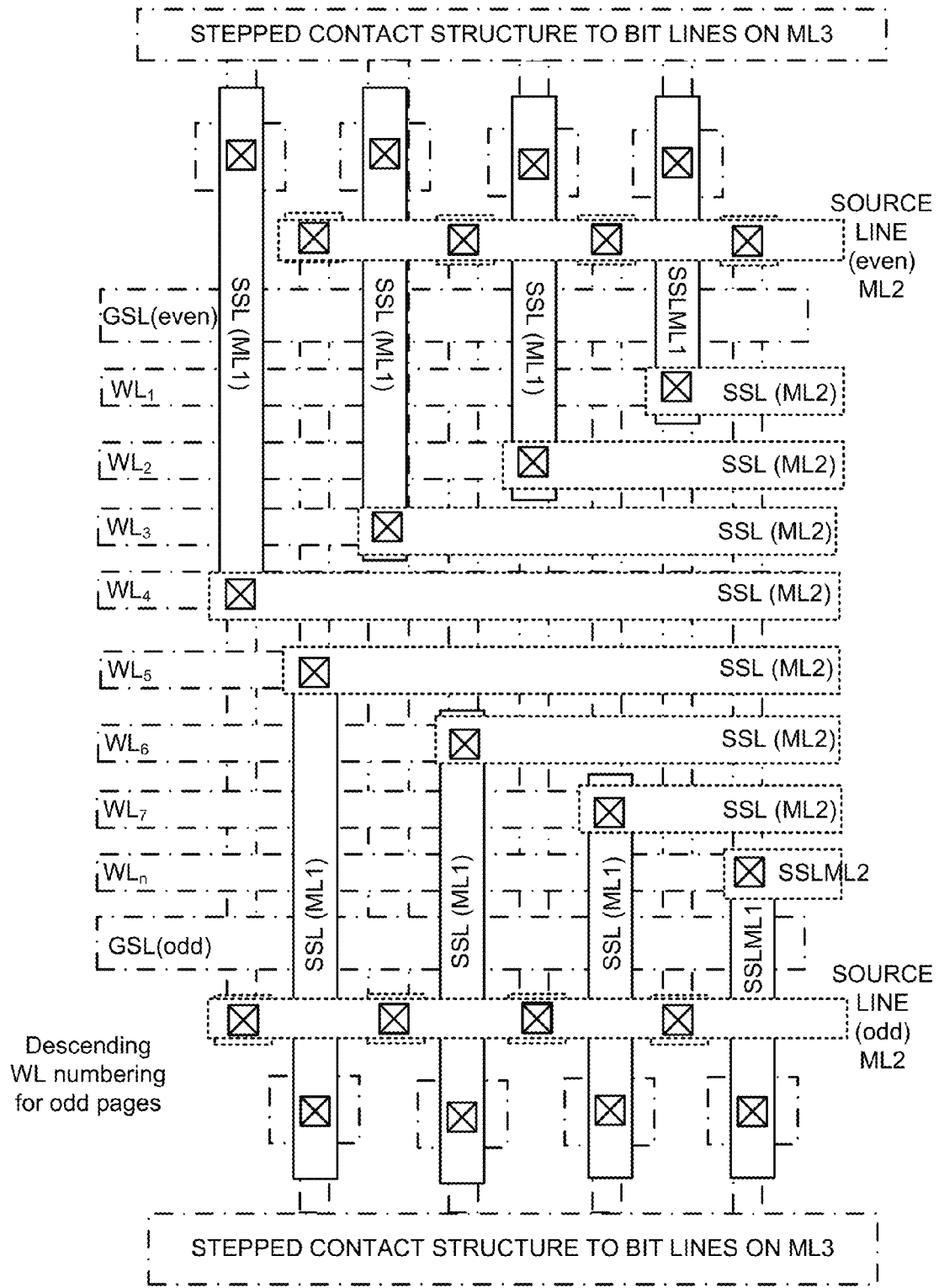
FIG. 12 is a layout view of the 3D NAND memory array structure shown in FIG. 9.

FIG. 12 is a layout view of the 3D NAND memory array structure shown in FIG. 9.

In the layout view of FIG. 12, the stacks of semiconductor strips are shown as vertical strips with dot-dash borders. Adjacent stacks of semiconductor strips alternate between the opposite orientations, of bit line end-to-source line end orientation, and source line end-to-bit line end orientation. Every other stack of semiconductor strips runs from the bit line structure at the top, to the source line at the bottom. Every other stack of semiconductor strips runs from the source line at the top, to the bit line structure at the bottom.

Overlying the stacks of semiconductor strips, are the horizontal word lines and the horizontal ground select lines GSL (even) and GSL (odd). Also overlying the stacks of semiconductor strips, are the SSL gate structures. The SSL gate structures overlie every other stack of semiconductor strips at the top end of the semiconductor strips, and overlie every other stack of semiconductor strips at the bottom end of the semiconductor strips. In either case, the SSL gate structures control electrical connection between any stack of semiconductor strips and the stack's corresponding bit line contact structure.

The shown word line numbering, ascending from 1 to N going from the top of the figure to the bottom of the figure, applies to even memory pages. For odd memory pages, the word line numbering descends from N to 1 going from the top of the figure to the bottom of the figure.

Overlying the word lines, ground select lines, and SSL gate structures, are the ML1 SSL string select lines running vertically. Overlying the ML1 SSL string select lines are the ML2 SSL string select lines running horizontally. Although the ML2 SSL string select lines are shown as terminating at corresponding ML1 SSL string select lines for ease of viewing the structure, the ML2 SSL string select lines may run longer horizontally. The ML2 SSL string select lines carry signals from the decoder, and the ML1 SSL string select lines couples these decoder signals to particular SSL gate structures to select particular stacks of semiconductor strips.

Also overlying the ML1 SSL string select lines are the source lines, even and odd.

Further, overlying the ML2 SSL string select lines are the ML3 bit lines (not shown) which connect to the stepped contact structures at the top and the bottom. Through the stepped contact structures, the bit lines select particular planes of semiconductor strips.

Figure 13:
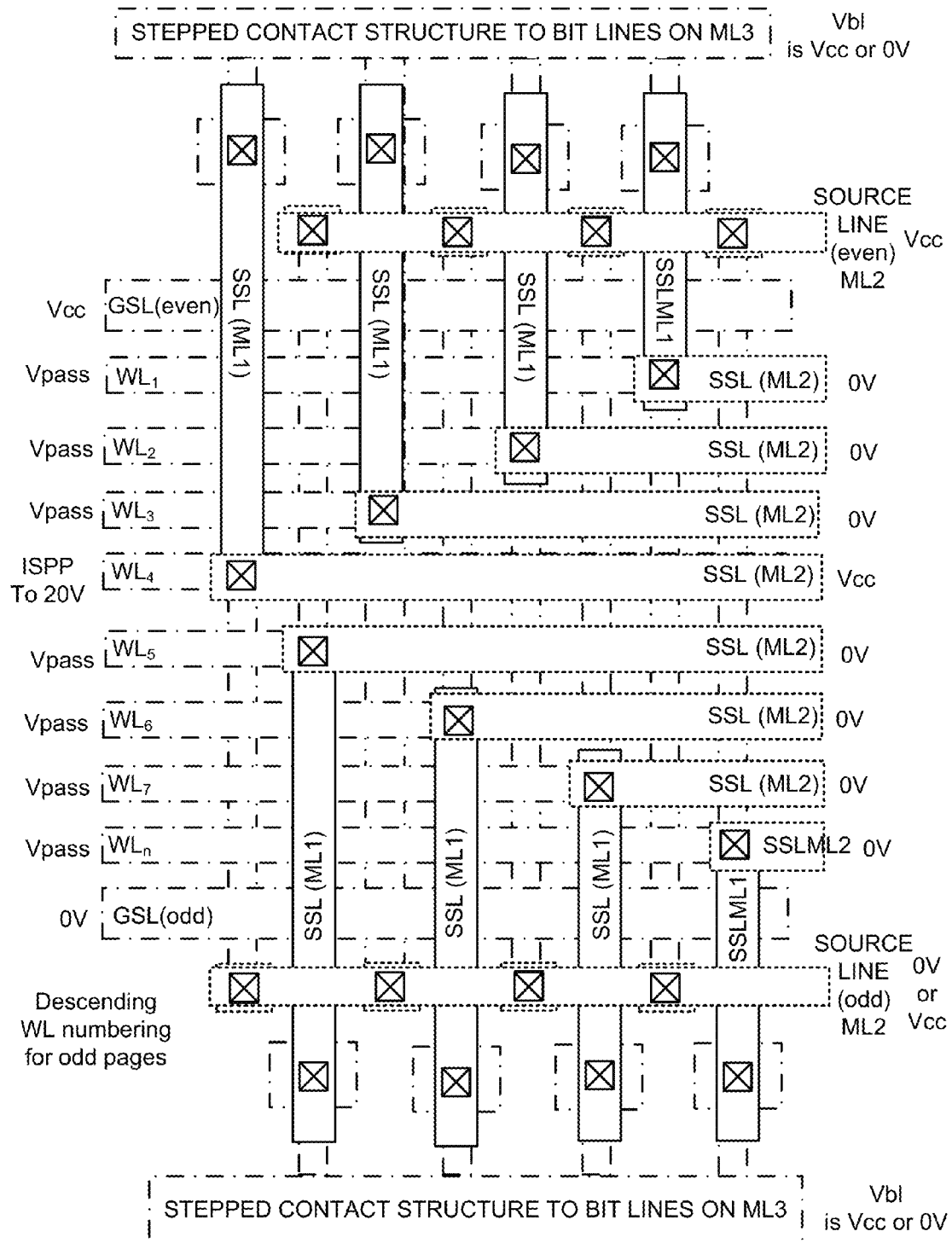
FIG. 13 is a layout view that shows an example bias arrangement according to one embodiment.

The layout view of FIG. 13 shows an example bias arrangement according to one embodiment. Particular bit lines, which in turn are electrically connected to different planes of semiconductor strips, are biased at either Vcc (inhibit) or 0V. The SSL of the selected stack of semiconductor strips is at Vcc, and all other SSL's are 0V. For this semiconductor strip in an "odd" stack, the GSL (even) is turned on at Vcc to allow the bit line bias to pass, and the GSL (odd) is turned off at 0V to disconnect the source line (odd). Source line (even) is at Vcc for self-boosting to avoid disturb of adjacent even pages. The word lines are at Vpass voltages, except for the selected word line which undergoes ISPP to 20V.

The shown memory unit is repeated above and below, sharing the same bit lines. These repeated units have the same bias arrangement applied to them at the same time, typically the same plane as the plane of the shown memory unit.

If instead a semiconductor strip in an "even" stack is selected, then the odd and even signals are switched.

Figure 14:
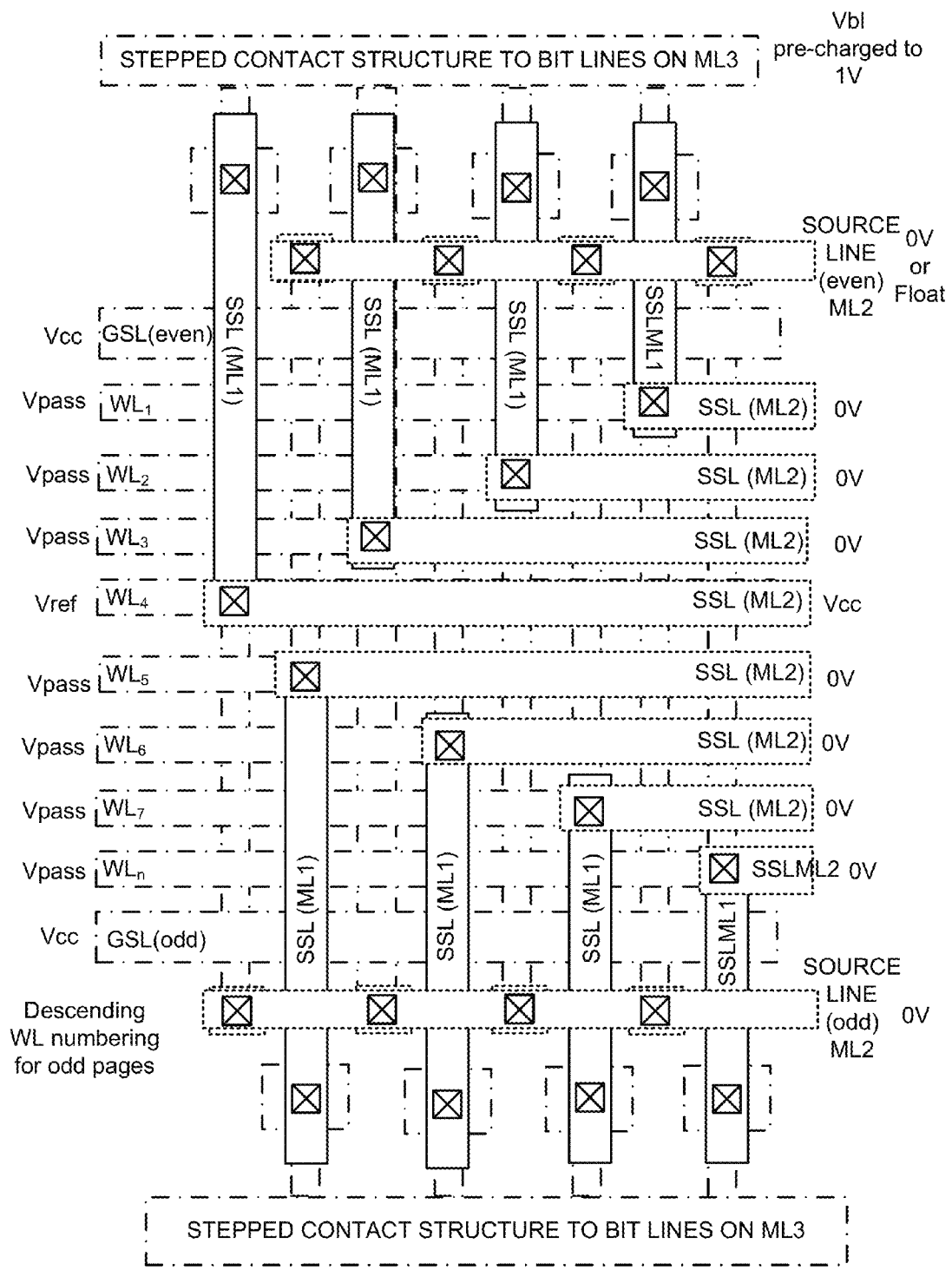
FIG. 14 is a layout view that shows an example of a bias arrangement according to another embodiment.

The layout view of FIG. 14 shows an example of a bias arrangement according to another embodiment. Particular bit lines, which in turn are electrically connected to different planes of semiconductor strips, are at a bias, such as pre-charge to 1V. The SSL of the selected stack of semiconductor strips is at Vcc, and all other SSL's are 0V. For this semiconductor strip in an "odd" stack being selected, both the GSL (even) is turned on at Vcc to allow the bit line bias to pass, and the GSL (odd) is turned on at Vcc to connect the source line (odd). Both source line (even) and source line (odd) are off at 0V. The word lines are at Vpass voltages, except for the selected word line which is at Vref.

The shown memory unit is repeated above and below, sharing the same bit lines. These repeated units also have the same biasing arrangement applied to them at the same time.

Figure 15:
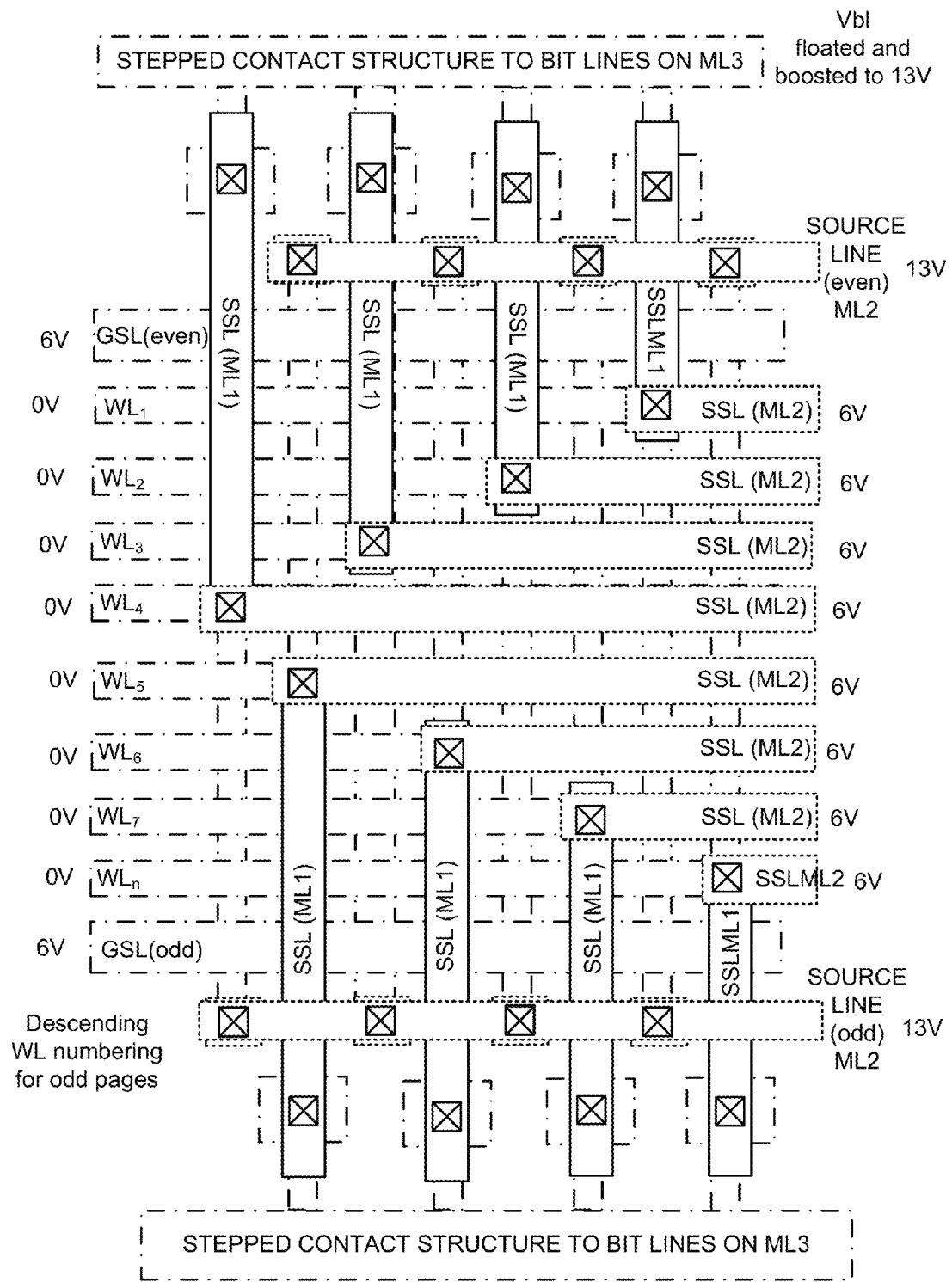
FIG. 15 is a layout view that shows an example of a bias arrangement according to another embodiment.

The layout view of FIG. 15 shows an example of a bias arrangement according to another embodiment. The source lines, even and odd, are at +13V. The bit lines, which in turn are electrically connected to different planes of semiconductor strips, are floated and boosted to 13V. The word lines are all at 0V. All the SSL, and both the even and odd GSL are at a medium voltage such as 6V to prevent unwanted charge tunneling.

The shown memory unit is repeated above and below, sharing the same bit lines.

Figure 16:
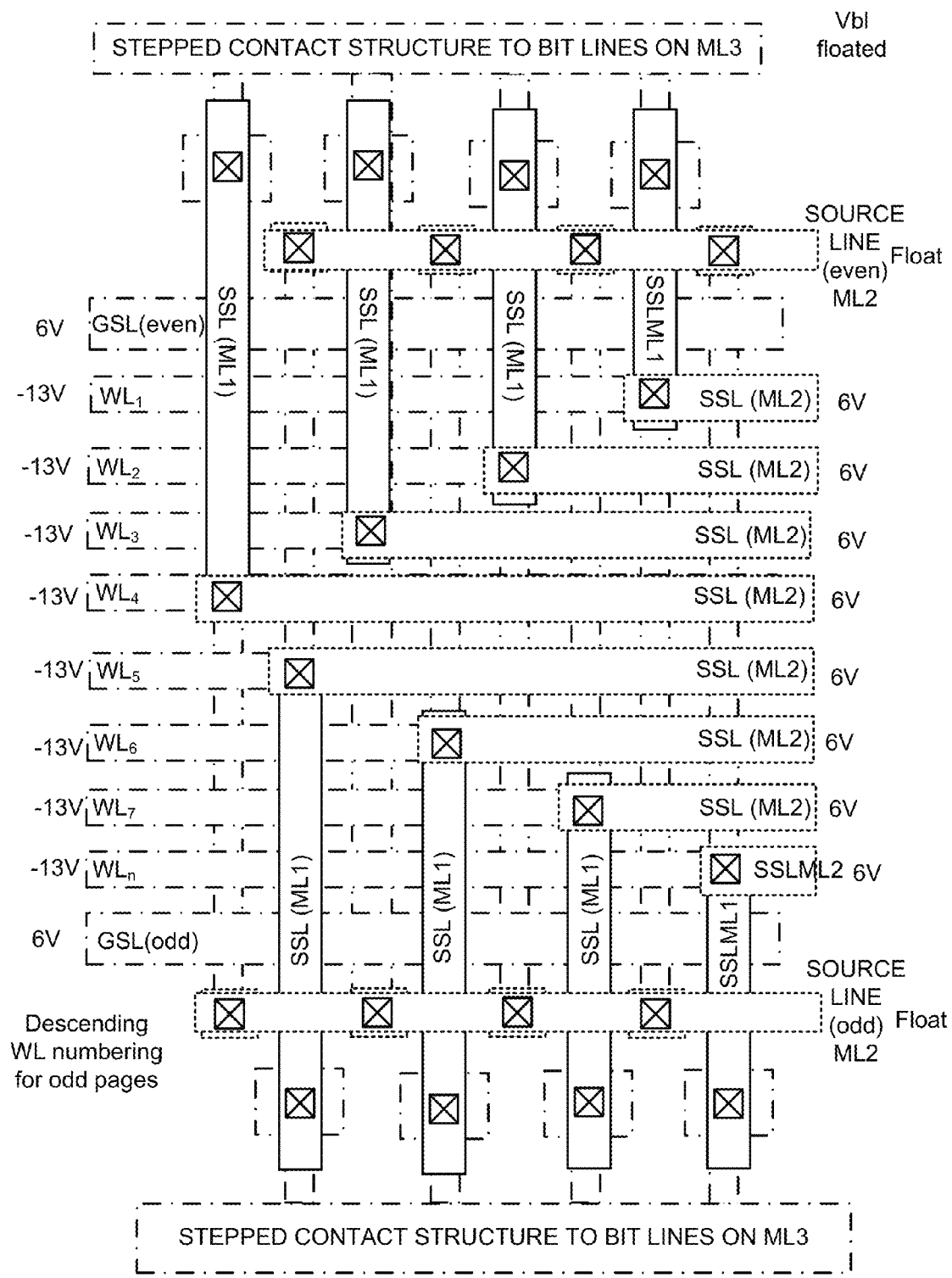
FIG. 16 is a layout view that shows an example of a bias arrangement according to another embodiment.

The layout view of FIG. 16 shows an example of a bias arrangement according to another embodiment. The word lines are all at −13V, and the source lines are floated.

Figure 17:
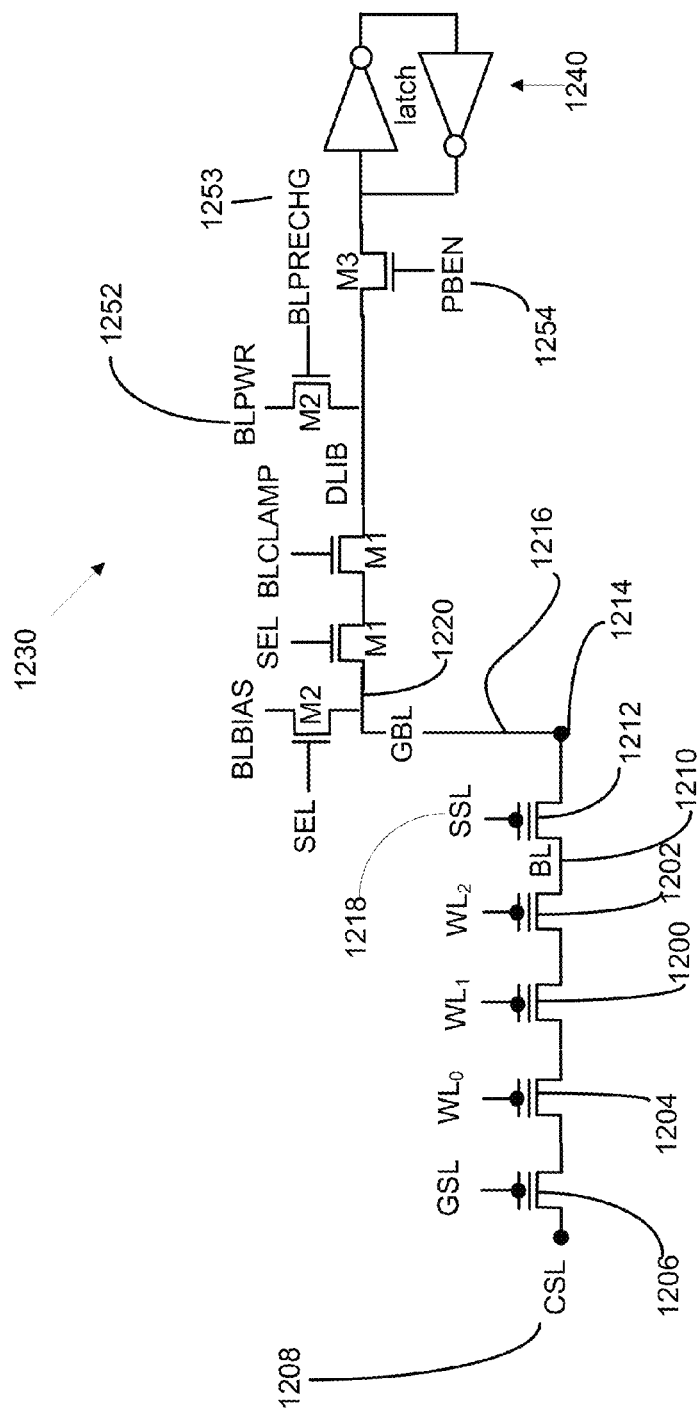
FIG. 17 is a schematic diagram of a circuit illustrating an example of bit line setup and sensing circuits coupled to a NAND string like that for example on a level of memory cells in a 3D array, like that shown in FIG. 9.

FIG. 17 is a schematic diagram of a circuit illustrating an example of bit line setup and sensing circuits coupled to a NAND string. The circuit of FIG. 17 is provided only as an example to illustrate bit line setup operations. From this example, it can be seen that it can be desired to isolate selected strings from the bit lines during setup. The selected memory cell 1200 is part of a NAND string formed by local bit line BL 1210 in a particular level of the array. The NAND string also includes memory cell 1202 and memory cell 1204. String select transistor 1212 selectively couples the bit line 1210 to the global bit line 1220 via contact pad 1214 and vertical connector 1216. The gate of the string select transistor 1212 is connected to string select line SSL 1218.

Block select transistor 1206 selectively couples the second end of the NAND string to common source line CSL 1208.

The global bit line 1220 is coupled by column decoder circuitry (not shown) to sensing circuitry 1230 via a page buffer circuit for the global bit line 1220. Signals BLCLAMP, VBOOST, BLPWR, BLPRECHG and PBEN are provided by voltage sources and the control logic used to control the timing and performance of an operation that includes a first interval, a second interval and a third interval according to the various bias arrangement and timing schemes described herein. A cell location decoder is used to provide cell location information for use in producing the VBOOST signal and the BLCLAMP signal as described below, based on the location of the selected cell in a particular level, or other sector or segment, of the array. In some embodiments, the cell location decoder is the same circuit as used for plane decoding for a 3D array.

Clamp transistor M1 is coupled between the global bit line 1220 and data line DLIB. Signal BLCLAMP is connected to the gate of the clamp transistor M1.

Pre-charge transistor M2 has a first terminal connected to the data line DLIB, a second terminal coupled to bit line power signal BLPWR, and a gate coupled to signal BLPRE-CHG. Controllable voltage source 1252 applies the BLPWR signal at a voltage level and timing that depend on the control sequence being executed. Control circuit 1253 applies the BLPRECHG signal at a voltage level and timing that depend on the control sequence being executed.

An enable transistor M3 is arranged between the data line DLIB and latch based sense amplifier circuit 1240. Control signal PBEN is connected to the gate of the enable transistor M3. Control logic 1254 applies the PBEN signal at a voltage level and timing that depend on the control sequence being executed.

Figure 18:
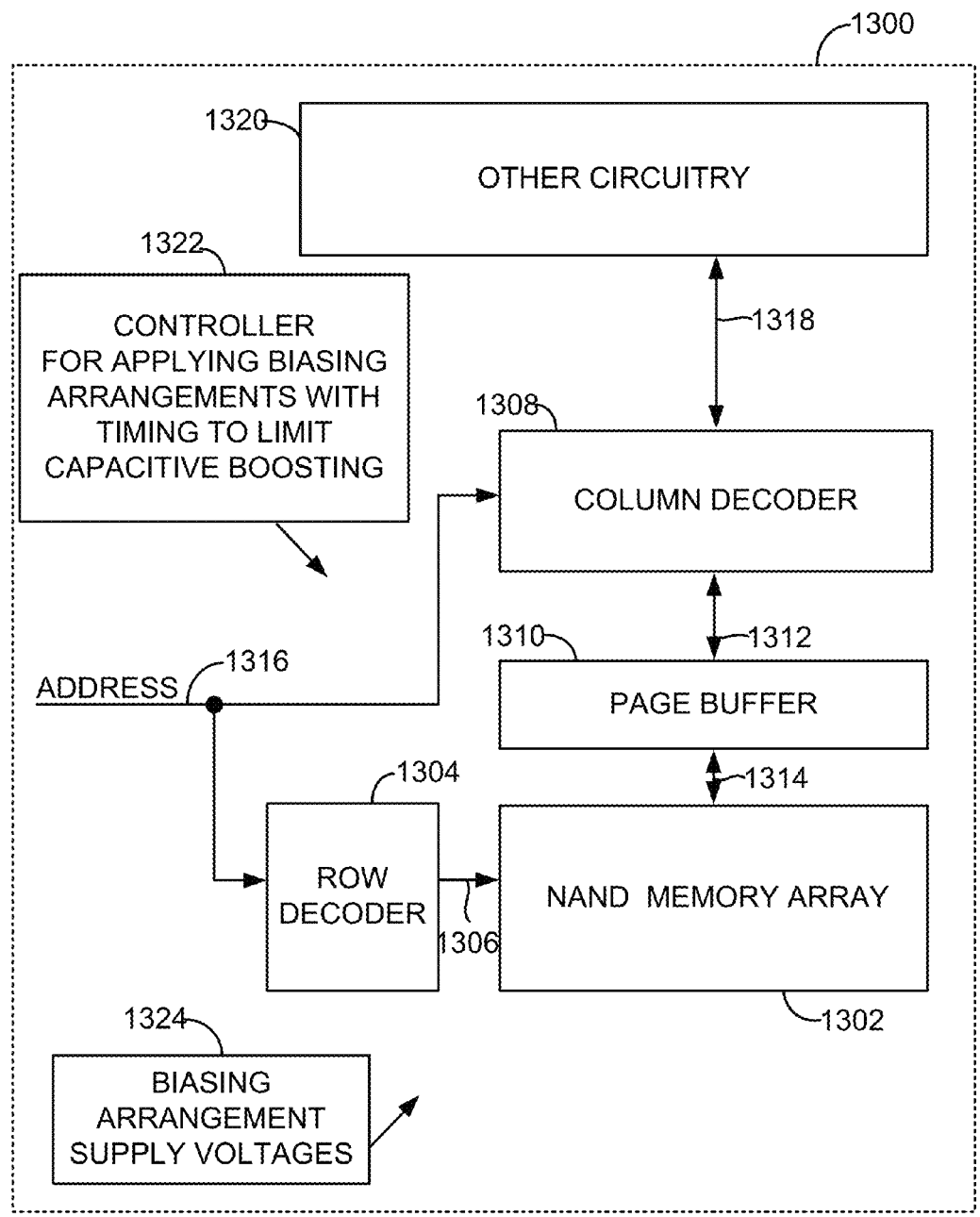
FIG. 18 is a block diagram of an integrated circuit memory employing memory cells and bias circuitry according to embodiments of the present invention.

FIG. 18 is a block diagram of an integrated circuit memory 1300 employing memory cells and bias circuitry according to embodiments of the present invention with a NAND memory array 1302 having modified operational logic as described herein. In some embodiments, the NAND memory array 1302 can include multiple levels of cells arranged in multiple NAND strings. A row decoder 1304 is coupled to a plurality of word lines 1306 arranged along rows in the NAND memory array 1302. Column decoders in block 1308 are coupled to a set of page buffers 1310, in this example via data bus 1312. The global bit lines 1314 are coupled to local bit lines (not shown) arranged along columns in the NAND memory array 1302. Addresses are supplied on bus 1316 to column decoders (block 1308) and row decoder (block 1304). Data is supplied via the data-in line 1318 from other circuitry 1320 (including for example input/output ports) on the integrated circuit, such as a general purpose processor or special purpose application circuitry, or a combination of modules providing system-on-a-chip functionality supported by the NAND memory array 1302. Data is supplied via the line 1318 to input/output ports or to other data destinations internal or external to the integrated circuit memory 1300.

A controller 1322, implemented for example as a state machine, provides signals to control the application of bias arrangement supply voltages generated or provided through the voltage supply or supplies in block 1324 to carry out the various operations described herein. These operations limit capacitive boosting as are described herein. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 19:
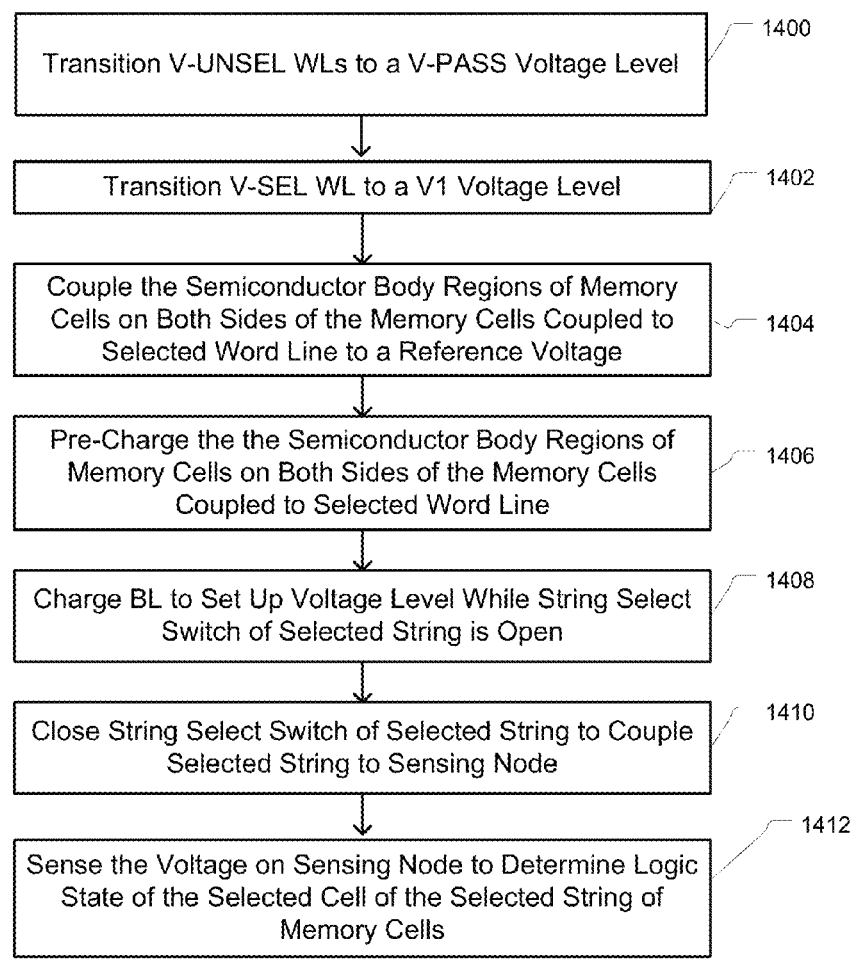
FIG. 19 is a flow chart illustrating logic executed by the controller shown in FIG. 18 in performing the operations described herein.

FIG. 19 is a flow chart illustrating logic executed by the controller in performing the operations described herein. The logic includes transitioning V-UNSEL WLs 1400 of the unselected word lines in the selected string of memory cells to a V-PASS voltage level. At step 1402 V-SEL WL of the word line that is coupled to the selected memory cell in the selected string of memory cells is transitioned to a V1 voltage level. At step 1404, the semiconductor body regions of the memory cells in the strings that are on both sides of the memory cells in the strings that are coupled to SEL WL are coupled to a reference voltage. It is appreciated that steps 1400, 1402 and 1404 can be performed interchangeably or simultaneously with each other. At step 1406, the semiconductor body regions of the memory cells in both the selected and unselected NAND strings, on both sides of the memory cells that are coupled to the selected word line, are pre-charged so as to limit self-induced capacitive boosting within the strings of memory cells.

At step 1408, the bit line that serves as the sensing node for the selected string of memory cells is set up for sensing. Such charging of the bit line is performed while the string select switch of the selected string is open in order to limit introduction of noise into the selected string. At step 1410, the string select switch of the selected string is closed so that the selected string is coupled to the bit line. At step 1412, the voltage on the sensing node is sensed to determine the logic state of the selected cell of the selected string of memory cells.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory comprising:
a plurality of sensing nodes and reference nodes;
a plurality of strings of memory cells, each string in the plurality being arranged for connection between a corresponding sensing node and a corresponding reference node in the plurality of sensing nodes and reference nodes, and including a string select switch to selectively connect the string to the corresponding sensing node and a ground select switch to selectively connect the string to the corresponding reference node;
a plurality of word lines, at least one string select line and a ground select line, word lines in the plurality of word lines coupled to corresponding memory cells in the plurality of strings, the at least one string select line coupled to corresponding string select switches in the plurality of strings and the ground select line coupled to corresponding ground select switches in the plurality of strings; and
logic and circuitry coupled to the plurality of word lines to apply a bias arrangement including:
a first interval in which a first voltage is set up on a selected word line, a second voltage, higher than the first voltage, is set up on unselected word lines in the plurality of word lines, and the semiconductor body of memory cells on both sides of the selected memory cell in the selected string is coupled to a reference voltage;
a second interval in which the string select switch for the selected string is open and bit line voltages are set up on the sensing node for a selected string; and
a third interval in which the string select switch for the selected string is closed and current flows in the selected memory cell if its threshold is below the first voltage.

2. The memory of claim 1 wherein the bias arrangement further includes:
setting a first reference voltage (e.g. 0V) on the reference node corresponding to the selected string during the first interval and the second interval;
setting a second reference voltage (e.g. 0V) on the sensing node corresponding to the selected string at least during a first portion of a duration of the first interval, and causing the bit line voltage to transition to a setup voltage during the second interval; and
setting a string select voltage on a string select line of the selected string such that the string select switch of the selected string is open during the second interval and closed during the first portion of the duration of the first interval.

3. The memory of claim 1, wherein the bias arrangement further includes, setting the selected word line to an initial voltage during at least a portion of the duration of the first interval and setting the selected word line to the first voltage during at least the third interval, the initial voltage on the selected word line being set at a voltage higher than thresholds of memory cells in a highest threshold state specified for the memory.

4. The memory of claim 2, wherein the bias arrangement further includes setting the selected word line to an initial voltage during at least a second portion of the duration of the first interval and setting the selected word line to the first voltage during at least the third interval, the initial voltage on the selected word line being set at a voltage higher than the thresholds of memory cells in a highest threshold state specified for the memory.

5. The memory of claim 2, wherein the bias arrangement further includes setting an unselected string select voltage on corresponding string select switches of unselected strings such that the corresponding string select switches of the unselected strings are closed during at least the first portion of the duration of the first interval and open during the second interval.

6. The memory of claim 3, wherein the bias arrangement further includes setting an unselected string select voltage on corresponding string select switches of unselected strings such that the corresponding string select switches of the unselected strings are open during the second interval, at least the portion of the first interval and at least a portion of the third interval.

7. The memory of claim 4, wherein the bias arrangement further includes setting an unselected string select voltage on corresponding string select switches of unselected strings such that the corresponding string select switches of the unselected strings are closed during at least the first portion of the duration of the first interval and open during the second interval.

8. The memory of claim 2, wherein the bias arrangement further includes, setting a switch open voltage (e.g. −3V) on the ground select line and on the at least one string select line that is coupled to the corresponding string select transistor of the selected string, the switch open voltage applied during a portion of the duration of the third interval such that the string select switch of the selected string and the corresponding ground select switches of the plurality of strings are open during the portion of the duration of the third interval during which the switch open voltage is applied.

9. The memory of claim 8, wherein the bias arrangement further includes setting the switch open voltage during the portion of the duration of the third interval on string select lines that are coupled to corresponding string select switches of unselected strings such that the corresponding string select switches of the unselected strings are closed during the portion of the duration of the sensing interval during which the switch open voltage is applied.

10. The memory of claim 1, wherein the plurality of strings of memory cells are arranged as NAND strings in a 3D array.

11. A method of biasing a memory cell in a plurality of strings of memory cells, comprising:
   during a first interval, setting up a first voltage on a selected word line in a plurality of word lines, setting up a pass voltage on unselected word lines in the plurality of word lines, and coupling the semiconductor body of memory cells on both sides of a selected memory cell of a selected string to a reference voltage;
   during a second interval, setting up a bit line voltage at a sensing node and opening a corresponding string select switch of the selected string; and
   during a third interval, closing the corresponding string select switch of the selected string so that current flows through the selected memory cell into the sensing node if the threshold of the selected memory cell is below the first voltage.

12. The method of claim 11 further comprising:
   setting a first reference voltage (e.g. 0V) on a reference node corresponding to the selected string during the first interval and the second interval;
   setting a second reference voltage (e.g. 0V) on the sensing node corresponding to the selected string at least during a first portion of a duration of the first interval, and causing the bit line voltage to transition to a setup voltage during the second interval; and
   setting a string select voltage on a string select line of the selected string such that the string select switch of the selected string is open during the second interval and closed during the first portion of the duration of the first interval.

13. The method of claim 11 further including setting the selected word line to an initial voltage during at least a portion of the duration of the first interval and setting the selected word line to the first voltage during at least the third interval, the initial voltage on the selected word line being set at a voltage higher than thresholds of memory cells in a highest threshold state specified for the memory.

14. The method of claim 12 further including setting the selected word line to an initial voltage during at least a second portion of the duration of the first interval and setting the selected word line to the first voltage during at least the third interval, the initial voltage on the selected word line being set at a voltage higher than the thresholds of memory cells in a highest threshold state specified for the memory.

15. The method of claim 12 further including setting an unselected string select voltage on corresponding string select switches of unselected strings such that the corresponding string select switches of the unselected strings are closed during at least the first portion of the duration of the first interval and open during the second interval.

16. The method of claim 13 further including setting an unselected string select voltage on corresponding string select switches of unselected strings such that the corresponding string select switches of the unselected strings are open during the second interval, at least a portion of the first interval and at least a portion of the third interval.

17. The method of claim 14 further including setting an unselected string select voltage on corresponding string select switches of unselected strings such that the corresponding string select switches of the unselected strings are closed during at least the first portion of the duration of the first interval and open during the second interval.

18. The method of claim 12 further including, setting a switch open voltage (e.g. −3V) on the ground select line and on the at least one string select line that is coupled to the corresponding string select transistor of the selected string, the switch open voltage applied during a portion of the duration of the third interval such that the string select switch of the selected string and the corresponding ground select switches of the plurality of strings are open during the portion of the duration of the third interval during which the switch open voltage is applied.

19. The method of claim 18 further including setting the switch open voltage during the portion of the duration of the third interval on string select lines that are coupled to corresponding string select switches of unselected strings such that the corresponding string select switches of the unselected strings are closed during the portion of the duration of the third interval during which the switch open voltage is applied.

20. The method of claim 11, wherein the plurality of strings of memory cells are arranged as NAND strings in a 3D array.

21. A method of biasing a memory cell in a plurality of strings of memory cells, comprising:
   setting up a first voltage on a selected word line in a plurality of word lines, setting up a pass voltage on unselected word lines in the plurality of word lines, and coupling the semiconductor body of memory cells on both sides of a selected memory cell of a selected string to a reference voltage or voltages;
   setting up a bit line voltage after said setting up and said coupling
   setting a string select voltage on a string select line of the selected string such that a string select switch of the selected string is open before setting up the bit line voltage and closed during the setting up of the bit line voltage.

22. The method of claim 21, wherein the first voltage is the same as the pass voltage that is set up on the unselected word lines.

* * * * *

UNITED STATES PATENT AND TRADEMARK OFFICE
CERTIFICATE OF CORRECTION

| | | |
|---|---|---|
| PATENT NO. | : 8,760,928 B2 | Page 1 of 1 |
| APPLICATION NO. | : 13/710992 | |
| DATED | : June 24, 2014 | |
| INVENTOR(S) | : Chen et al. | |

It is certified that error appears in the above-identified patent and that said Letters Patent is hereby corrected as shown below:

In the Claims:

In claim 21, column 24, line 47, after the word "coupling", please insert -- ; and --.

Signed and Sealed this
Thirtieth Day of September, 2014

Michelle K. Lee
*Deputy Director of the United States Patent and Trademark Office*